US010546661B2

(12) United States Patent
Pegna et al.

(10) Patent No.: US 10,546,661 B2
(45) Date of Patent: Jan. 28, 2020

(54) ADDITIVE MANUFACTURING TECHNIQUE FOR PLACING NUCLEAR REACTOR FUEL WITHIN FIBERS

(71) Applicant: FREE FORM FIBERS, LLC, Saratoga Springs, NY (US)

(72) Inventors: Joseph Pegna, Saratoga Springs, NY (US); Erik G. Vaaler, Redwood City, CA (US); Shay L. Harrison, East Schodack, NY (US); John L. Schneiter, Cohoes, NY (US); Kirk L. Williams, Saratoga Springs, NY (US); Ram K. Goduguchinta, Ballston Lake, NY (US)

(73) Assignee: FREE FORM FIBERS, LLC, Saratoga Springs, NY (US)

( * ) Notice: Subject to any disclaimer, the term of this patent is extended or adjusted under 35 U.S.C. 154(b) by 28 days.

(21) Appl. No.: 15/320,800

(22) PCT Filed: Jun. 23, 2015

(86) PCT No.: PCT/US2015/037080
§ 371 (c)(1),
(2) Date: Dec. 21, 2016

(87) PCT Pub. No.: WO2015/200257
PCT Pub. Date: Dec. 30, 2015

(65) Prior Publication Data
US 2017/0213604 A1 Jul. 27, 2017

Related U.S. Application Data

(60) Provisional application No. 62/015,603, filed on Jun. 23, 2014, provisional application No. 62/099,734,
(Continued)

(51) Int. Cl.
*G21C 3/20* (2006.01)
*G21C 21/02* (2006.01)
(Continued)

(52) U.S. Cl.
CPC ............... *G21C 3/20* (2013.01); *C23C 16/08* (2013.01); *C23C 16/483* (2013.01); *G21C 3/07* (2013.01);
(Continued)

(58) Field of Classification Search
CPC . G21C 3/20; G21C 21/02; G21C 3/04; G21C 3/07; G21C 3/18; G21C 3/28;
(Continued)

(56) References Cited

U.S. PATENT DOCUMENTS 3,103,476 A * 9/1963 Mumm ................... G21C 3/06
376/419
3,285,825 A * 11/1966 Jens ......................... G21C 3/18
376/412
(Continued)

FOREIGN PATENT DOCUMENTS

JP 2013-210372 A 10/2013

OTHER PUBLICATIONS

Rosso, "Ceramic and metal matrix composites: Routes and properties", Journal of Materials Processing Technology 175 (2006) 364-375. (Year: 2006).*
(Continued)

*Primary Examiner* — Peter M Poon
*Assistant Examiner* — Daniel Wasil
(74) *Attorney, Agent, or Firm* — Kevin P. Radigan, Esq.; Heslin Rothenberg Farley & Mesiti P.C.

(57) ABSTRACT

Nuclear fuel structures and methods for fabricating are disclosed herein. The nuclear fuel structure includes a plurality of fibers arranged in the structure and a multilayer fuel
(Continued)

region within at least one fiber of the plurality of fibers. The multilayer fuel region includes an inner layer region made of a nuclear fuel material, and an outer layer region encasing the nuclear fuel material. A plurality of discrete multilayer fuel regions may be formed over a core region along the at least one fiber, the plurality of discrete multilayer fuel regions having a respective inner layer region of nuclear fuel material and a respective outer layer region encasing the nuclear fuel material. The plurality of fibers may be wrapped around an inner rod or tube structure or inside an outer tube structure of the nuclear fuel structure, providing both structural support and the nuclear fuel material of the nuclear fuel structure.

26 Claims, 16 Drawing Sheets

Related U.S. Application Data filed on Jan. 5, 2015, provisional application No. 62/133,596, filed on Mar. 16, 2015, provisional application No. 62/153,715, filed on Apr. 28, 2015.

(51) Int. Cl.

| | | |
|---|---|---|
| *G21C 3/07* | (2006.01) | |
| *C23C 16/08* | (2006.01) | |
| *C23C 16/48* | (2006.01) | |
| *G21C 3/18* | (2006.01) | |
| *G21C 3/28* | (2006.01) | |
| *G21C 3/62* | (2006.01) | |

(52) U.S. Cl.
CPC ............... *G21C 3/18* (2013.01); *G21C 3/28* (2013.01); *G21C 3/62* (2013.01); *G21C 21/02* (2013.01)

(58) Field of Classification Search
CPC .......... G21C 3/42; G21C 3/62; C04B 35/565; C04B 35/62857; C04B 35/6286; C04B 35/62863; C04B 35/62865; C04B 35/62868; C04B 35/62873; C04B 35/62878; C04B 35/62884; C04B 35/62889; C04B 35/62894; C04B 35/62897; C04B 35/806; C04B 35/83; C23C 16/08; C23C 16/483

USPC .......................................................... 376/414
See application file for complete search history.

(56) References Cited

U.S. PATENT DOCUMENTS

| | | | | |
|---|---|---|---|---|
| 3,308,031 | A * | 3/1967 | Pon ........................ | G21C 3/322 |
| | | | | 376/454 |
| 3,855,061 | A * | 12/1974 | Triggiani ................. | G21C 3/16 |
| | | | | 376/411 |
| 4,751,044 | A * | 6/1988 | Hwang .................... | G21C 3/06 |
| | | | | 376/416 |
| 5,094,804 | A * | 3/1992 | Schweitzer ............ | G21C 3/044 |
| | | | | 376/414 |
| 5,147,598 | A * | 9/1992 | Kapil ...................... | G21C 3/18 |
| | | | | 376/414 |
| 5,349,618 | A * | 9/1994 | Greenspan ............. | G21C 3/326 |
| | | | | 376/428 |
| 5,867,552 | A * | 2/1999 | Marlowe .................. | G21C 3/07 |
| | | | | 376/417 |
| 5,916,497 | A * | 6/1999 | Bromley ................. | G21C 3/623 |
| | | | | 376/428 |
| 2006/0039524 | A1 | 2/2006 | Feinroth et al. | |
| 2009/0220040 | A1* | 9/2009 | Takagi ..................... | G21C 3/07 |
| | | | | 376/416 |
| 2011/0286570 | A1 | 11/2011 | Farmer et al. | |
| 2013/0010915 | A1 | 1/2013 | Garnier et al. | |
| 2013/0077731 | A1 | 3/2013 | Sherwood et al. | |
| 2013/0163711 | A1* | 6/2013 | Zabiego .................. | G21C 3/16 |
| | | | | 376/433 |
| 2013/0329849 | A1 | 12/2013 | Mazaudier | |

OTHER PUBLICATIONS

Glazoff et al., "Morphological Analysis of Zirconium Nuclear Fuel Rods Braided with SiC: Qality Assurance and Defect Identification", Journal of Nuclear Materials, 451.1 (Apr. 12, 2014) (pp. 216-224).

Pegna et al., International Search Report & Written Opinion for PCT/US2015/037080 (PCT Publication No. WO 2015/200257 A1), dated Oct. 23, 2015 (10 pages).

* cited by examiner

ADDITIVE MANUFACTURING TECHNIQUE FOR PLACING NUCLEAR REACTOR FUEL WITHIN FIBERS

CROSS-REFERENCE TO RELATED APPLICATIONS

This application is a § 371 U.S. National Phase application which claims priority from International Application Serial No. PCT/US2015/037080, filed Jun. 23, 2015, which published Dec. 30, 2015, as PCT Publication No. WO 2015/200257 A1. International Application Serial No. PCT/US2015/037080 claims the benefit of priority of U.S. Provisional Application Ser. No. 62/015,603, filed Jun. 23, 2014, entitled "An Additive Manufacturing Technology for the Fabrication and Characterization of Nuclear Reactor Fuel", and from U.S. Patent Application Ser. No. 62/099,734, filed Jan. 5, 2015, entitled "An Additive Manufacturing Technology for the Fabrication and Characterization of Nuclear Reactor Fuel", and from U.S. Patent Application Ser. No. 62/133,596, filed Mar. 16, 2015, entitled "An Additive Manufacturing Technology for the Fabrication and Characterization of Nuclear Reactor Fuel", and from to U.S. Patent Application Ser. No. 62/153,715, filed Apr. 28, 2015, entitled "An Additive Manufacturing Technology for the Fabrication and Characterization of Nuclear Reactor Fuel". Each of these applications is hereby incorporated herein by reference in its entirety.

BACKGROUND OF THE INVENTION

Nuclear energy continues to be an important source of energy for the United States and many countries around the world, as nuclear fuel can provide greater amounts of energy over long time periods without many of the problems associated with fossil fuel use, such as greenhouse gas emissions. The inherent risks in using and storing nuclear fuel sources, the need for ensuring safe operation of nuclear reactors, and the risks of nuclear fuel being misused to create weapons continue to drive innovation in developing safe and secure nuclear fuel technologies.

BRIEF SUMMARY

Various shortcomings of the prior art are overcome, and additional advantages are provided through the provision, in one aspect, of a nuclear fuel structure which includes a plurality of fibers arranged in the nuclear fuel structure and a multilayer fuel region within at least one fiber of the plurality of fibers. The multilayer fuel region includes an inner layer region with a nuclear fuel material, an outer layer region encasing the nuclear fuel material.

In another aspect, also provided is a method of facilitating fabricating a nuclear fuel structure, where the facilitating fabricating includes providing a plurality of fibers arranged in the nuclear fuel structure and forming a multilayer fuel region within at least one fiber of the plurality of fibers. The multilayer fuel region formed includes an inner layer region having a nuclear fuel material, and an outer layer region encasing the nuclear fuel material.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Nuclear energy production continues to be important in many countries to meet current and predicted future energy demands. Nuclear fuel materials, such as uranium and uranium-based compounds, have a much greater energy density than other energy sources such as fossil fuels, and may have energy densities over a million times greater than, for example, gasoline or coal fuels. Safe handling and storing of nuclear fuel materials within nuclear reactors, as well as prevention of nuclear reactor accidents and meltdowns, continue to be important issues in nuclear energy production, as several well-known nuclear reactor accidents illustrate, such as the Three Mile Island incident, the Chernobyl disaster, and the recent Fukushima Daiichi meltdown.

Figure 1:
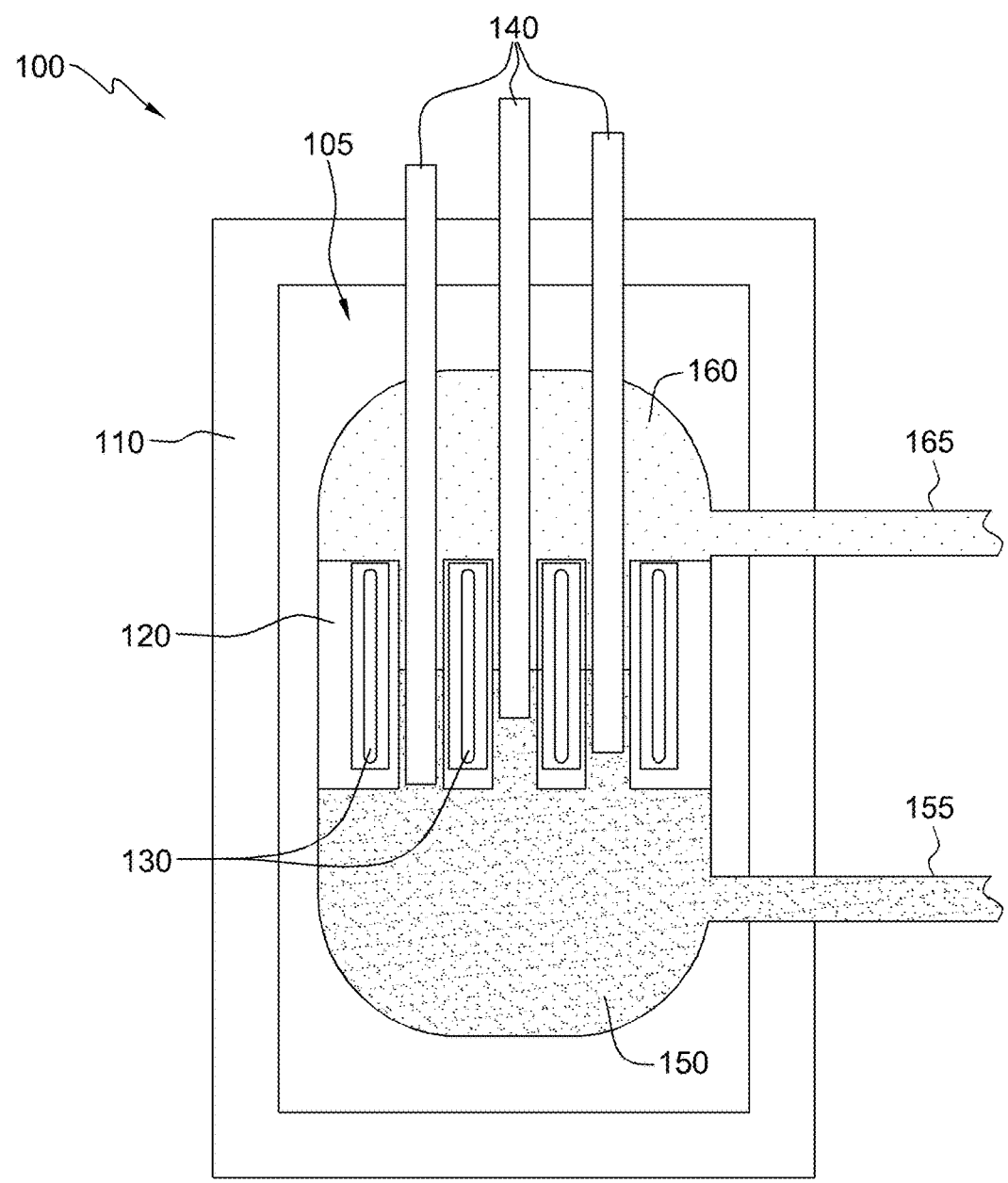
FIG. 1 depicts an exemplary layout of a nuclear reactor, illustrating generally the use of nuclear fuel structures in nuclear reactor operation.

FIG. 1 is a simplified schematic of an example nuclear reactor 100, as may be part of a nuclear power plant. The nuclear reactor 100 depicted in FIG. 1 includes a reactor vessel 105 encased inside a reactor shield 110, which may be made of concrete or other material capable of withstanding high temperatures, so that material within the reactor shield 110 may be contained in the event of an accident. Reactor vessel 105 includes a core 120 in which nuclear fuel rods 130 and control rods 140 are disposed. Reactor vessel 105 also holds a coolant material 150, such as water or heavy water, which may be drawn into reactor 105 through a coolant inlet 155. Fuel rods 130 include a nuclear fuel material, frequently uranium dioxide fuel capsules, encased in a metal alloy fuel rod casing or cladding, such as a zirconium alloy metal casing. (Many nuclear fuel rods make use of zirconium alloy cladding materials produced under the trademark name Zircaloy.) The nuclear fuel material is bombarded with neutrons that can initiate a fission reaction in the nuclear fuel; the reaction splits the nucleus of the nuclear fuel material, releasing heat energy and additional neutrons that subsequently continue the fission reaction. The heat energy heats the coolant 160, which may then be pumped out of reactor vessel 105 via coolant outlet 165; the heated coolant 160 may be used, for example, to generate steam to drive turbines that in turn generate electrical energy (not depicted in FIG. 1 for simplicity). Core 120 may be made of one or more moderator materials, such as graphite, capable of slowing neutrons down to speeds at which the neutrons are more likely to react with the nuclei of the nuclear fuel material. Coolant material 150 may also act as a moderator material to slow down high-speed neutrons bombarding fuel rods 130. Control rods 140 may be used to variably control a fission rate of the nuclear fuel material in fuel rods 130. Control rods 140 may be made of one or more materials capable of absorbing neutrons without undergoing a fission reaction, such as boron, silver, cadmium, and/or indium. As control rods 140 are pulled out partially or fully from the reactor vessel 105, more neutrons may successfully bombard and react with nuclear fuel material in fuel rods 130, increasing energy output; conversely, by inserting the rods further or fully into reactor vessel 105, more neutrons may be absorbed and the nuclear fission reactions slowed to reduce energy production. In some nuclear reactors, fully inserting control rods 140 may be used to fully stop fission reactions in fuel rods 130.

Figure 2A:
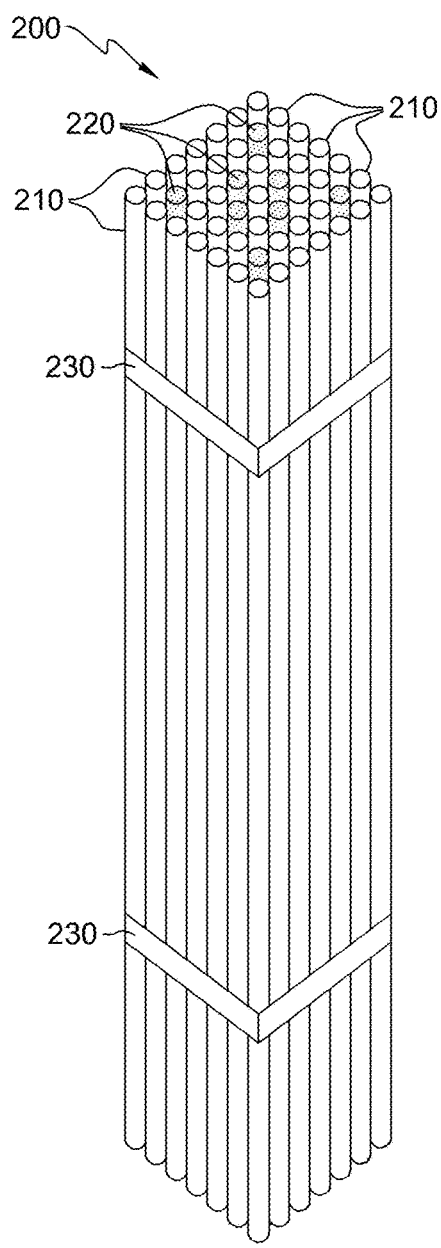
FIGS. 2A-2B depict an example structure including multiple nuclear fuel rod structures and control rod structures, illustrating one possible structure for encasing and storing nuclear fuel structures.
Figure 2B:
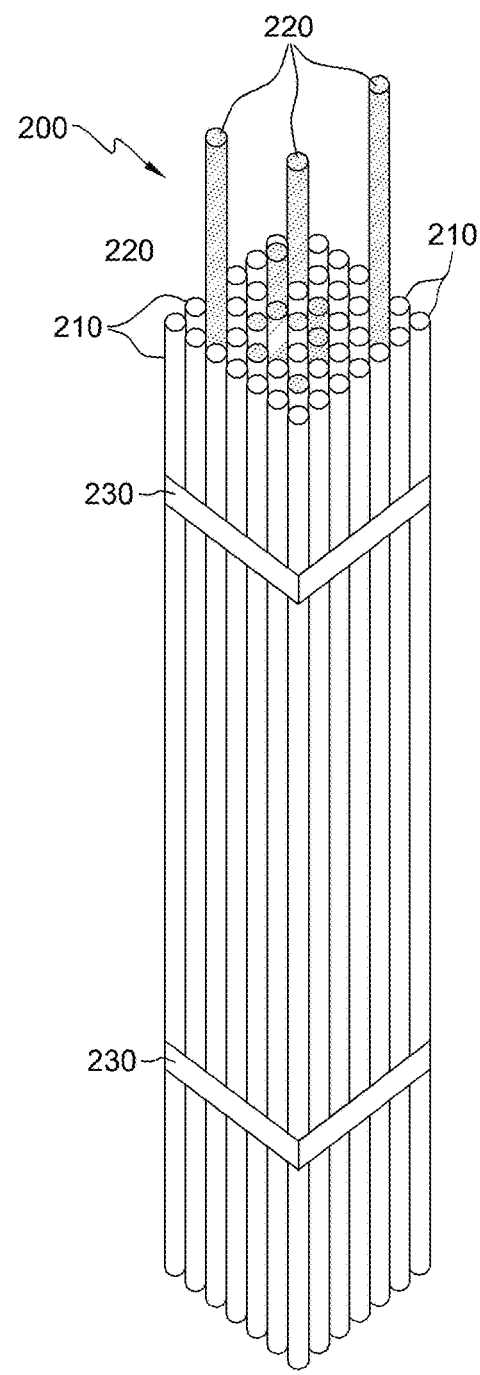

FIGS. 2A and 2B illustrate an example of a nuclear fuel assembly 200, as may be deployed in a nuclear reactor. Generally, nuclear fuel rods 130 and control rods 140, as depicted in FIG. 1, are not deployed separately in a nuclear reactor, but are more often deployed in a nuclear fuel assembly such as nuclear fuel assembly 200. Nuclear fuel rods 210 may be arrayed together with control rods 220 interspersed among the nuclear fuel rods 210, and both nuclear fuel rods 210 and control rods 220 bound by one or more spacers 230. The entire nuclear fuel assembly 200 may be deployed within a nuclear reactor vessel, such as reactor vessel 105 of FIG. 1, so that the nuclear fuel assembly is surrounded by moderator materials, such as the core 120, and coolant 150 may flow around fuel rods 210 and control rods 220. The control rods 220 may be coupled with controls within or outside the reactor vessel so that the control rods 220 may be variably withdrawn or inserted further into nuclear fuel assembly 200, as illustrated by FIG. 2B.

Referring to FIG. 1 again, it may be noted that coolant 150 may serve several purposes within nuclear reactor 100. Coolant 160, being heated by the heat generated from fission reactions, carries away heat from the fuel rods 130 and core 120, and the heat energy of coolant 160 may be converted to electrical energy. As well, coolant 150, 160 may act as a moderator to slow neutrons to speeds at which they are more likely to successfully react with nuclear fuel material. In a loss of coolant accident (LOCA), coolant levels may drop within the reactor vessel 105 so that heat energy is no longer adequately conveyed out of the reactor, allowing heat to build within the reactor and potentially damage fuel rods 130, including the casing material. Although a loss of coolant may also represent a loss of moderator material, and thus result in a slow-down of fission reactions in the nuclear fuel material, heat may still build rapidly in the reactor vessel as the radioactive nuclear fuel materials, as well as radioactive by-products of fission reactions, continue to radiate heat energy into the reactor. Both the Three Mile Island disaster and the Fukushima Daiichi disaster began as loss of coolant accidents, resulting in a meltdown and highly exothermic oxidation of the zirconium alloy cladding, producing vast amounts of hydrogen gas and resulting in further heat build-up and a subsequent core meltdown. Once the cladding of fuel rods has been breached or cracked in a meltdown, the radioactive nuclear fuel and its radioactive fission by-products may be exposed and mix with other gases produced by the meltdown, allowing the radioactive materials to escape into the surrounding environment.

Figure 3A:
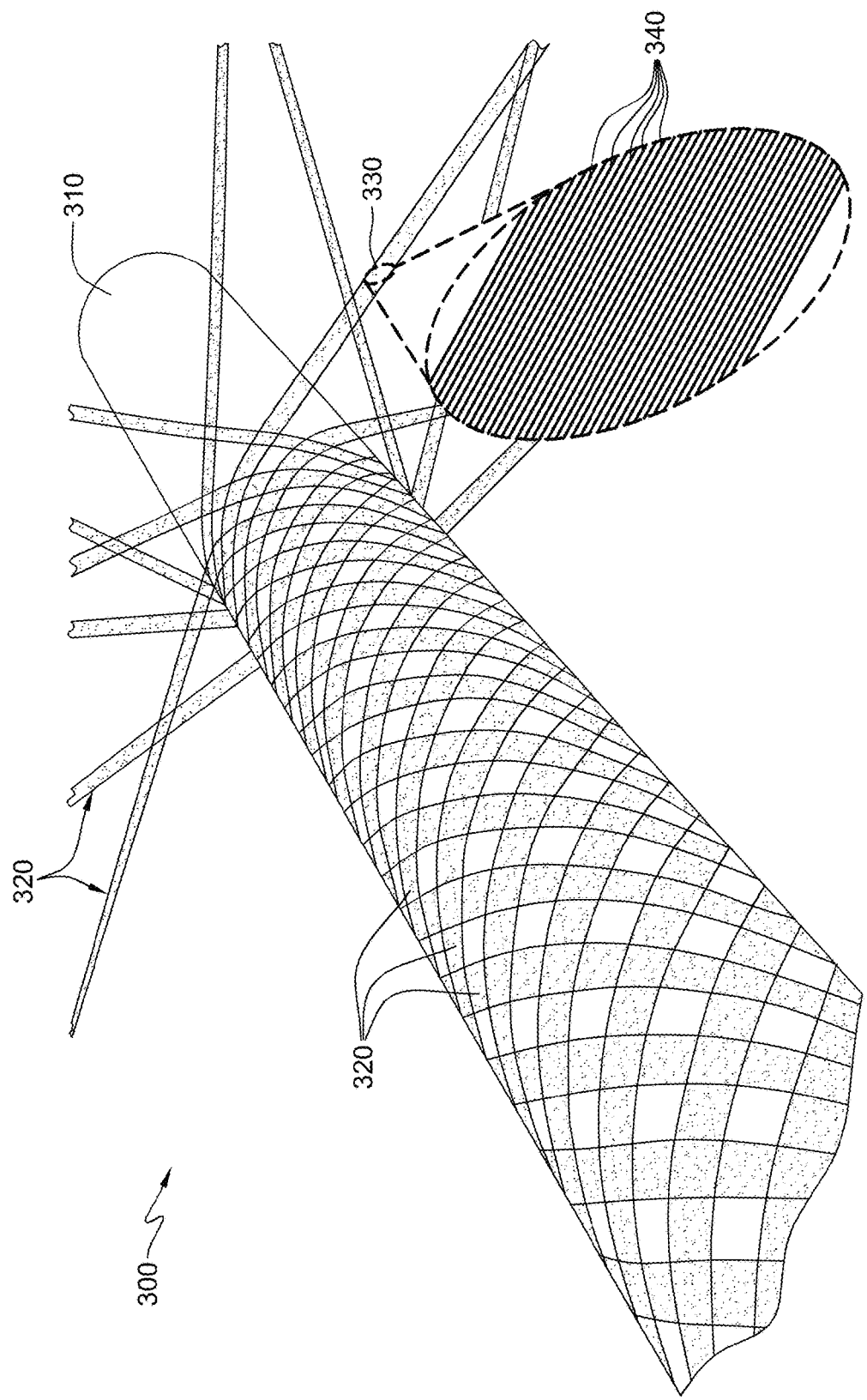
FIGS. 3A-3B depict one embodiment of a portion of a nuclear fuel structure or cladding structure, in accordance with one or more aspects of the present invention.
Figure 3B:
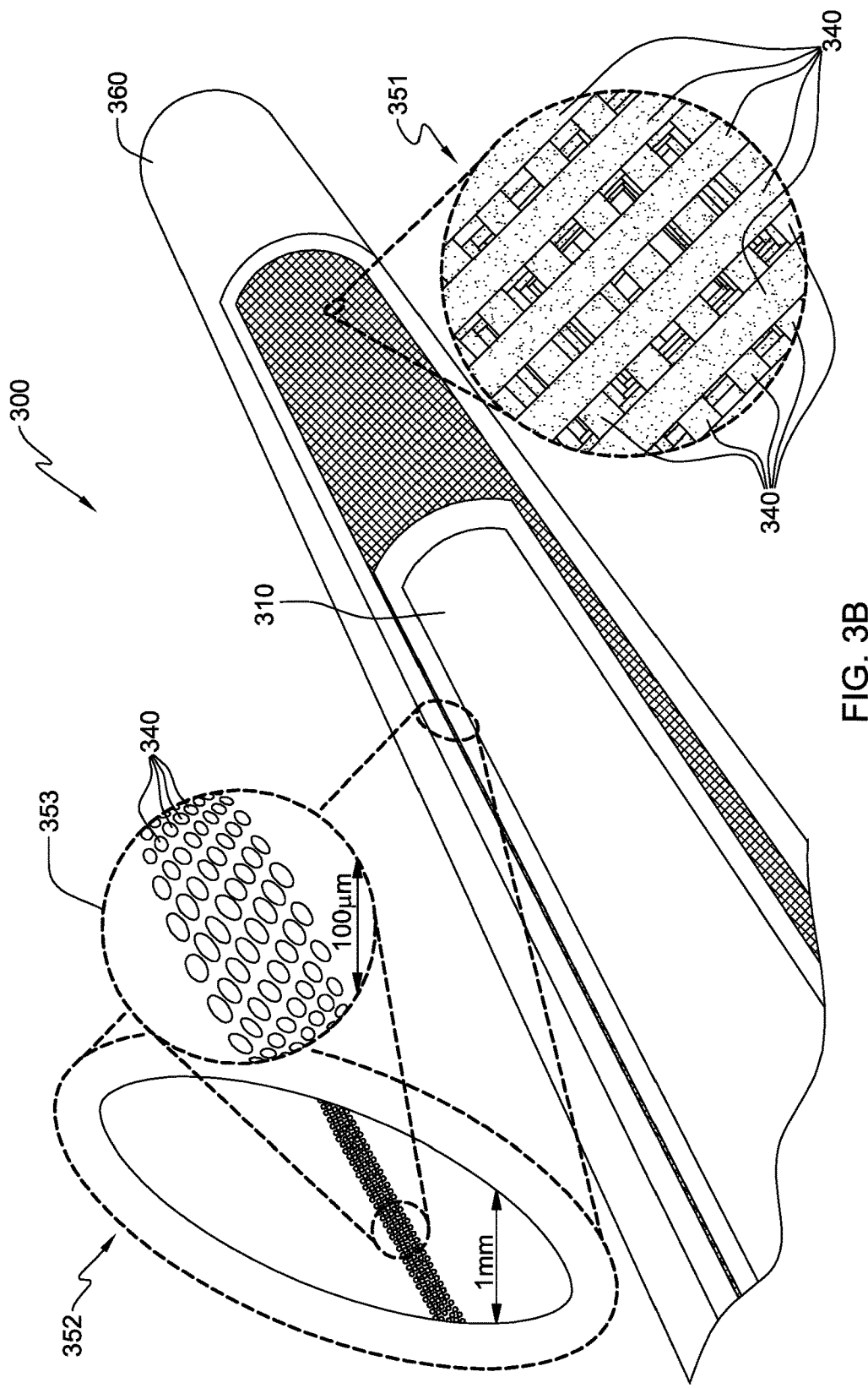

Incidents such as Three Mile Island have spurred research into alternative and safer fuel rod cladding materials that can replace zirconium alloy cladding and other cladding materials. Silicon carbide (SiC), for example, may be one such alternative cladding material. Although silicon carbide is a relatively brittle material, its brittleness may be mitigated by the use of silicon carbide fiber ($SiC_f$) reinforced silicon carbide matrix ($SiC_m$) Ceramic-Matrix Composite (CMC) structures. FIGS. 3A-3B illustrate one example embodiment of a reinforced $SiC_f$—$SiC_m$ CMC structure. FIG. 3A depicts one embodiment of a structure 300 including a tube 310, such as a monolithic SiC tube, with a plurality of reinforcing ribbons 320 of SiC fibers or tows 340 braided or wound around tube 310. Reinforcing ribbons may include, for example, a plurality of SiC fibers or tows 340 as illustrated by the close-up view of portion 330 of one ribbon 320. Fibers or tows 340 may include a silicon-carbide compound, such as SiC$_f$. FIG. 3A illustrates one example of a braiding or winding process and pattern of ribbons 320, with additional alternating strands not included in order to simplify the figure and better illustrate the exemplary pattern. Other patterns and processes of braiding or winding ribbons may also be possible. For example, ribbons 320 could also be braided inside tube 310 (not shown in FIG. 3A for clarity of illustration).

FIG. 3B illustrates structure 300 with multiple layers of ribbons 320 encasing tube 310, and embedded an outer layer 360 covering the ribbons 320 and tube 310. The roles of 310 and 360 may be reversed, in which case 360 is an outer tube encasing the multiple layers of ribbon 320 and then covered with an inner layer 310. For clarity of presentation, the former architecture is assumed without loss of generality. Outer layer 360 may also include SiC, in which case structure 300 may be a SiC$_f$—SiC$_m$ CMC structure. Outer layer 360 may be provided, for example, by a chemical vapor infiltration (CVI) process and/or a chemical vapor deposition (CVD) process. Close-up view 351 shows a view of a portion of the plurality of fibers 340 as seen looking radially into the structure 300, illustrating how fibers 340 may be ideally arranged in an ideal 'cross-weave' type pattern to provide reinforcement to structure 300 while providing open porosities to facilitate CVD or CVI. Close-up views 352 and 353 show a cross-sectional view of a cut-away portion of the plurality of fibers 340, illustrating one way in which fibers 340 may be ideally arranged to layer over tube 310. The exemplary structure 300 illustrated by FIG. 3B depicts eight layers of ribbons 320 layered over tube 310 for illustration purposes only; in practice, many more layers of ribbons 320 may be provided over tube 310 for structural reinforcement, or fewer layers of ribbons 320 may be needed. Alternatively, tube 310 and matrix 360 may be reversed to reflect a winding or braiding of ribbons 320 inside tube 310.

Reinforced CMC structures, such as the exemplary structure 300 illustrated by FIGS. 3A-3B, may have a toughness comparable to metals, such as zirconium alloys, but with much greater tolerance for high temperatures. For example, beta-phase stoichiometric silicon carbide (β-SiC) CMCs retain their strength at a temperature of 1500° C. under irradiation. As well, β-SiC materials may exhibit low oxidation rates at high temperatures, and may have a relatively low reactivity with nuclear fuel compounds such as uranium dioxide (UO$_2$). However, even reinforced CMC structures are not without drawbacks. For example, although SiC compounds had been identified as possible substitutes for zirconium alloy cladding when the Fukushima power plants were built, silicon carbide cladding fuel rods were still expensive to produce and use. Unlike metal alloys, which may be readily welded to seal fuel pellets within a metal alloy cladding, SiC materials do not readily fuse together, making it difficult to fully hermetically seal nuclear fuel pellets within a silicon carbide tube. As well, SiC CMC reinforced cladding is generally made relatively thick in order to overcome the inherent brittleness of pure silicon carbide; however, metal cladding of current fuel rods can be made relatively thin compared to SiC CMC cladding. Thus, in order for many SiC CMC clad fuel rods to be used as replacements for metal alloy clad fuel rods in current nuclear reactors, the SiC CMC cladding would have to be kept to a thickness similar to metal cladding, but at such thicknesses the cladding may not provide adequate structural reinforcement to the fuel rod.

Tristructural-isotropic (TRISO) nuclear fuel may address some of these shortcomings. TRISO nuclear fuel encapsulates nuclear fuel in multiple spherical layers enclosed in a SiC sphere. The spherical design, however, provides a relatively low ratio of nuclear fuel volume fraction, requiring higher enrichments and more frequent replacement, thereby increasing the burden of storing spent nuclear fuel safely.

As well, not every silicon carbide CMC may be suitable for use as cladding, but those CMCs that are suitable present challenges and drawbacks as well. For example, one of the few SiC$_f$ tow used to reinforce CMC materials currently being used to develop nuclear fuel rod structures is Hi-Nicalon Type-S(HNS), a commercially available β-SiC$_f$ compound that sufficiently approaches stoichiometry and that can withstand high doses of neutron bombardment during use in a nuclear reactor. However, HNS fibers typically do not form a well-ordered arrangement of continuous fibers as shown in the close-up views 351, 353 depicted in FIG. 3B. Instead, FINS fibers tend to twist and tangle, forming clumps of silicon carbide and leaving spaces or voids within the braided tow structure around tube 310. These problems occur regardless of the specific process used to form and deposit the HNS fibers, whether by chemical vapor infiltration (CVI) and/or chemical vapor deposition (CVD), polymer infiltration and pyrolysis (PIP), or melt infiltration processes. This tendency of HNS fibers to tangle and clump may also reduce the resulting CMC 300 fiber volume fraction in some portions of the braided fiber structure around tube 310, leaving those portions more susceptible to cracking. Formation of HNS reinforced CMC cladding by a melt infiltration process also tends to form pockets of silicon along portions of the HNS fibers; as silicon expands once it turns solid, the silicon pockets become weak points in the CMC that are highly susceptible to cracking.

Thus, generally stated, disclosed herein is a nuclear fuel structure or cladding structure which includes a plurality of fibers arranged in the nuclear fuel structure and a multilayer fuel region within at least one fiber of the plurality of fibers. The multilayer fuel region includes an inner layer region with a nuclear fuel material, an outer layer region encasing the nuclear fuel material. As used herein, the term "fiber" can refer to any elongated structure along which discrete regions may be formed. This may include, but is not limited to, any CMC structure(s), filaments or filamentary structures, and other similar structures of the type disclosed herein. Filamentary structures may include, for example, structures that curl around a helix or branch out into multiple filaments or fibers. When used as cladding, the plurality of fibers may contain no fiber having a multilayer fuel structure. In any instance, the plurality of fibers may also contain elements intended to interact with nuclear reactions, for example material included as burnable poisons.

In one embodiment, the plurality of fibers are arranged in the nuclear fuel structure to provide structural reinforcement to at least a portion of the nuclear fuel structure. The nuclear fuel structure may include an inner rod or tube structure, and the plurality of fibers may be wrapped around the inner rod or tube structure to facilitate providing structural reinforcement. As one or more of the plurality of fibers may also include a multilayer fuel region or regions within the one or more fibers, a CMC tube reinforced with a plurality of fibers may not only serve as stand-alone nuclear fuel but may also serve as cladding containing the additional nuclear fuel pellets.

Figure 11:
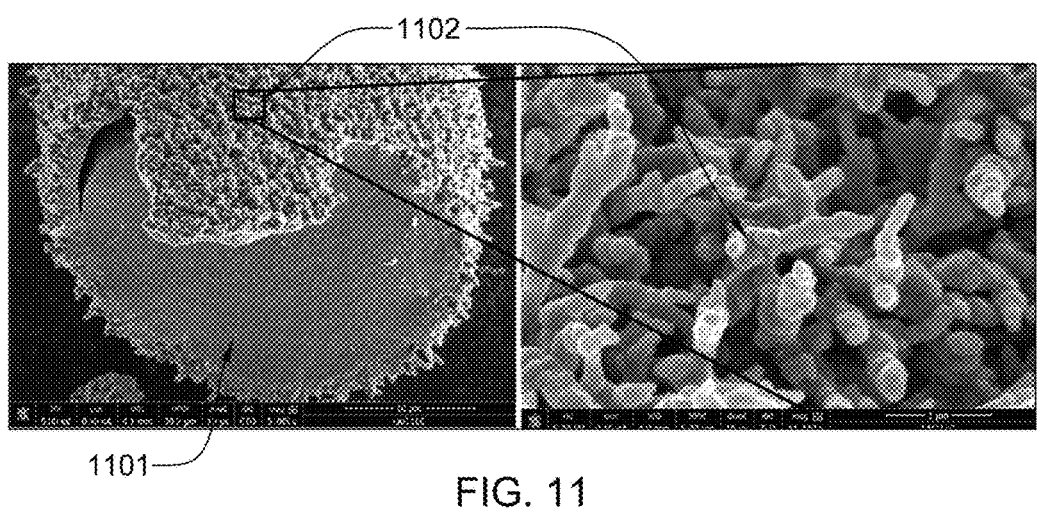
FIG. 11 depicts one embodiment of a nanoporous carbon layer, in accordance with one or more aspects of the present invention.

In another embodiment, the inner layer region having the nuclear fuel material may be a first inner region, and the structure may also include a second inner layer region below the first inner layer region. The second inner layer region may include a material selected to capture by-products, such as gaseous by-products, of nuclear fission reactions occurring in the nuclear fuel material. As exemplified in FIG. 11, the material of the second inner layer region 1102 may be, in one example, nanoporous carbon deposited upon a scaffold filament 1101.

In yet another embodiment, the multilayer fuel region is one multilayer fuel region of a plurality of discrete multilayer fuel regions disposed along the at least one fiber. The plurality of discrete multilayer fuel regions may each have a respective inner layer region of nuclear fuel material and a respective outer layer region encasing the nuclear fuel material. The plurality of discrete multilayer fuel regions may be formed over a core filament along the length of the at least one fiber.

In yet another embodiment, the fibers may include, in addition to or instead of a multilayer fuel region, an additional material layer selected to interact with nuclear fuel material in order to moderate or delay nuclear fission. In one example the additional material layer may include carbon as a moderator. In another example the additional material layer may include boron or gadolinium as a nuclear poison or burnable poison to delay nuclear fission.

In another aspect, also disclosed herein is a method of facilitating fabricating a nuclear fuel structure, where the facilitating fabricating includes providing a plurality of fibers arranged in the nuclear fuel structure and forming a multilayer fuel region within at least one fiber of the plurality of fibers. The multilayer fuel region formed includes an inner layer region having a nuclear fuel material, and an outer layer region encasing the nuclear fuel material. In one example, forming at least one layer of the multilayer fuel region may be accomplished by a chemical vapor deposition (CVD) process. In another example, the method may also include providing an inner rod or tube structure of the nuclear fuel structure, and arranging the plurality of fibers to wrap around the inner rod or tube structure so that the plurality of fibers provide structural reinforcement to the nuclear fuel structure.

Figure 4A:
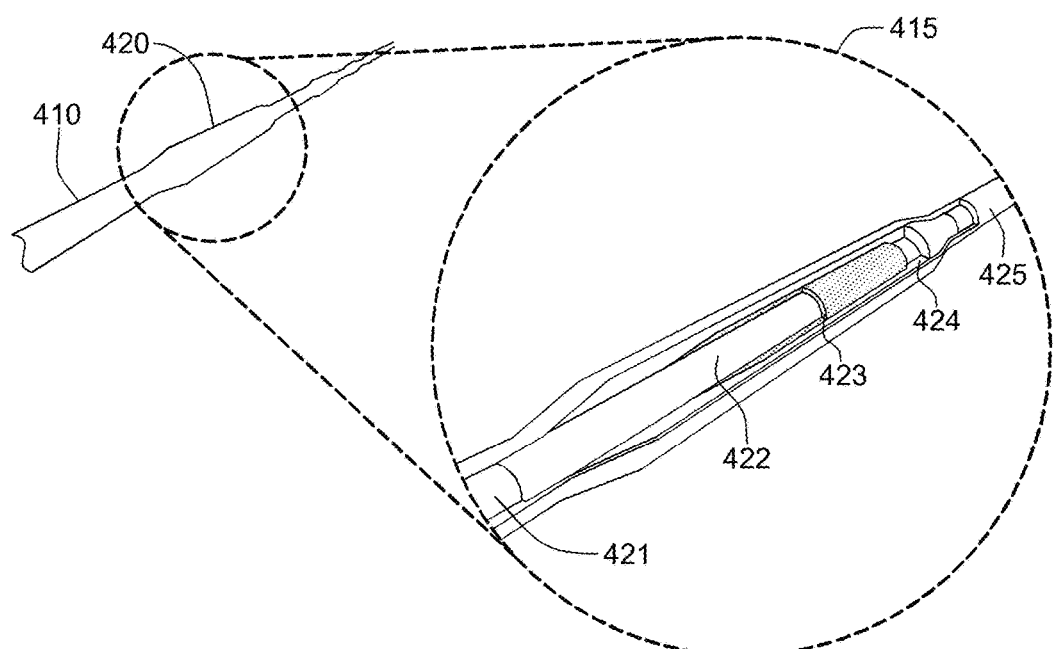
FIG. 4A depicts one embodiment of a fiber including a multilayer fuel region, in accordance with one or more aspects of the present invention.

FIG. 4A depicts one embodiment of a fiber 410 that includes a multilayer fuel region 420. A cutaway view 415 of multilayer fuel region 420 is provided to show clearly the multiple layers of multilayer fuel region 420. Multilayer fuel region 420 has an inner layer region 423 that includes nuclear fuel material, such as uranium or a uranium compound, and an outer layer region 424 that encases the nuclear fuel material of inner layer region 423. The nuclear fuel material of inner layer region 423 may be uranium dioxide ($UO_2$), as uranium dioxide may be used frequently as a nuclear fuel in many nuclear fuel structures. However, because the inner layer region 423 is completely, hermetically sealed by outer layer region 424, uranium, plutonium or fissile material-containing compounds with a higher fissile material density than that of uranium dioxide may also be used, such as uranium mononitride (UN), uranium carbide (UC), and uranium silicide ($U_2Si_3$). Outer layer region 424 may include, for example, pyrolytic carbon (PyC), and/or may include silicon carbide. In the exemplary multilayer fuel region depicted in FIG. 4A, inner layer region 423 may be considered a first inner layer region 423 and multilayer fuel region 420 may include a second inner layer region 422 disposed below the first inner layer region 423. The second inner layer region may include a material, such as nanoporous carbon, selected to capture by-products of nuclear fission reactions, such as gaseous by-products, occurring in the nuclear fuel material of inner layer region 423.

Outer layer region 424 may include, for example, pyrolytic carbon (PyC), and/or may include silicon carbide. Outer layer region 424 may, in one embodiment, be a first outer layer region 424, and multilayer fuel region 420 may include a second outer layer region. Second outer layer region may include a material that adds further functionality to fiber 410. For example, a second outer layer region may include a nuclear poison material, such as boron or gadolinium, that may delay activity of the nuclear fuel material of inner layer region 423. Second outer layer region, in another example, may include a material, such as carbon, that acts as a moderator of nuclear fission activity of the nuclear fuel material of inner layer region 423. In another example, second outer layer region may include an interphase layer for structural integration with a SiC matrix.

Multilayer fuel region 420 may be formed over a core region 421. Core region 421 may be, for example, a silicon carbide filament along a length of fiber 410, over a portion of which the multiple layers of multilayer fuel region 420 are formed. Core region 421 generally may include any ceramic material, such as silicon carbide or hafnium carbide. Finally, an overcoat layer 425 may further encase the multiple layers of multilayer fuel region 420 and core region 421. Overcoat layer 425 may itself be a multilayer overcoat. Overcoat layer 425 may include a ceramic material, such as silicon carbide or hafnium carbide, and may include additional overcoat layers that further functionalize the fiber. For example, an additional layer may be a layer of pyrolytic carbon (PyC) applied as a CMC interphase layer. In another example, an additional layer may include boron nitride applied to serve both as an interphase layer and a burnable nuclear poison layer to inhibit nuclear fission reactions in nuclear fuel material 423. Multilayer fuel region 420 may be one multilayer fuel region of a plurality of discrete multilayer fuel regions 420 disposed along fiber 410, as illustrated in FIG. 4A. Each discrete multilayer fuel region 420 may have a respective inner layer region 423 made of the nuclear fuel material, and a respective outer layer region 424 encasing the nuclear fuel material. The plurality of discrete multilayer fuel regions may be disposed over core region 421 along the length of the at least one fiber 410. Overcoat layer 425 may encase the plurality of discrete multilayer fuel regions 420 and core filament 421, resulting in a completed fiber 410. Overcoat layer 425, as depicted in FIG. 4A, may have a substantially uniform thickness along the length of fiber 410. As illustrated by FIG. 4A, the plurality of discrete multilayer fuel regions 420 appear as "beads" disposed along fiber 410, as the plurality of discrete multilayer fuel regions have a greater thickness than regions of fiber 410 including core filament 421 and overcoat 425 without a multilayer fuel region.

Figure 4B:
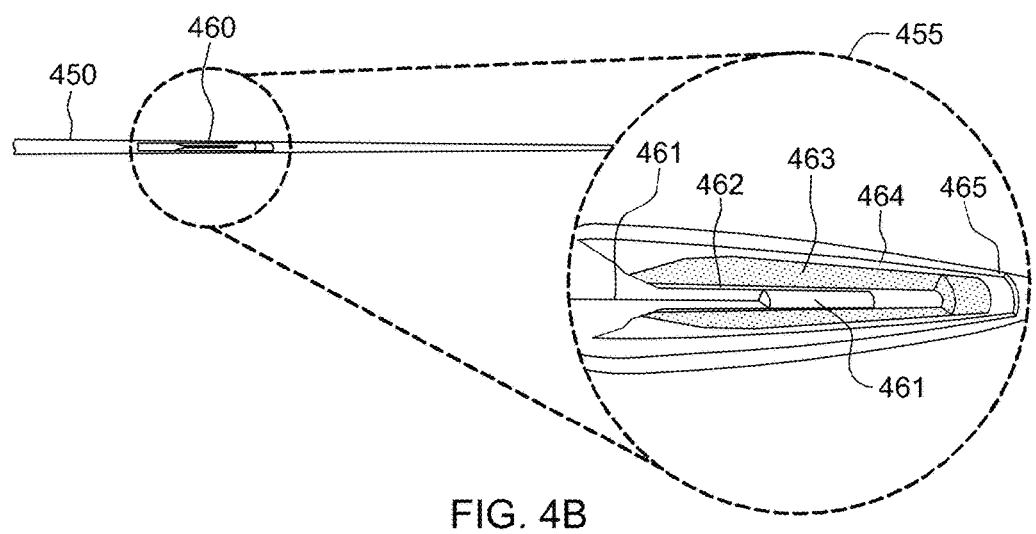
FIG. 4B depicts another embodiment of a fiber including a multilayer fuel region, in accordance with one or more aspects of the present invention.

FIG. 4B is a close-up, cross-sectional view 455 of an alternative embodiment of a fiber 450 that includes a multilayer fuel region 460, in which the fiber 450 has a substantially uniform thickness, so that multilayer fuel region 460 appears to be embedded within fiber 450. In the alternative embodiment of FIG. 4B, first inner layer region 463, second inner layer region 462, outer layer region 464, and overcoat 465 may have varying thicknesses over a length of multilayer fuel region 460, with a thickness of a layer tapering at either end of multilayer fuel region 460. In one exemplary embodiment, core region 461 may be provided to have a variable thickness prior to providing the layers of multilayer fuel region 460. In another exemplary embodiment, core region 461 may have a substantially uniform thickness, and multilayer fuel region 460 may be formed over core region 461 and may initially have a beaded appearance as depicted in FIG. 4A, but overcoat layer 465 may be provided with a variable thickness over multilayer fuel region 460 and core region 461, resulting in fiber 450 having a substantially uniform thickness along a length of fiber 450.

The exemplary embodiments of fibers 410 and 450, as depicted in FIGS. 4A and 4B, are only two possible embodiments of a fiber including a multilayer fuel region 420, 460, and including a plurality of discrete multilayer fuel regions 420, 460. Variations of the examples depicted, as well as alternative multilayer fuel region embodiments, may be possible and contemplated within the scope of the disclosure herein. For example, fibers such as fibers 410/450 may have other functionality added by either or both of coating or doping. Specifically, fibers may embed materials intended to either enhance or inhibit nuclear fission reactions, either temporarily or permanently. In one example, fibers can be coated or doped with materials intended to enhance nuclear reaction, which transmute into isotopes that are themselves fissionable. Examples of such isotopes are Thorium-232 and Uranium-238. In another example, fibers can be coated or doped with neutron-absorbing isotopes that inhibit nuclear reactions. Among such isotopes—known as "nuclear poisons"—are temporary inhibitors called "burnable poisons", such as boron and gadolinium. Other elements are long-term inhibitors, such as hafnium. In one example, dopant may be added to a fiber or fibers during fabrication, and become part of a microstructure of the fiber, either as interstitial elements, substitution elements, or concentrated at grain boundaries. In yet another example, functional coatings can be coated locally over the entire length of a fiber. A coating can also be applied to the fibers in compound form, where the coating can serve to meet additional functional requirements. For example, boron can be added in the form of boron nitride, which can also serve as a lubricant interphase in a ceramic matrix composite. Boron can also be added as boron carbide. Similarly, hafnium can be coated as hafnium carbide and serve as a high-temperature environmental barrier. Without any loss of generality, any references herein to a fiber 410 and/or multilayer fuel region 420, as depicted in FIG. 4A, may also be considered to be applicable to a fiber 450 and/or multilayer fuel region 460, as depicted in FIG. 4B, and vice versa.

Figure 4C:
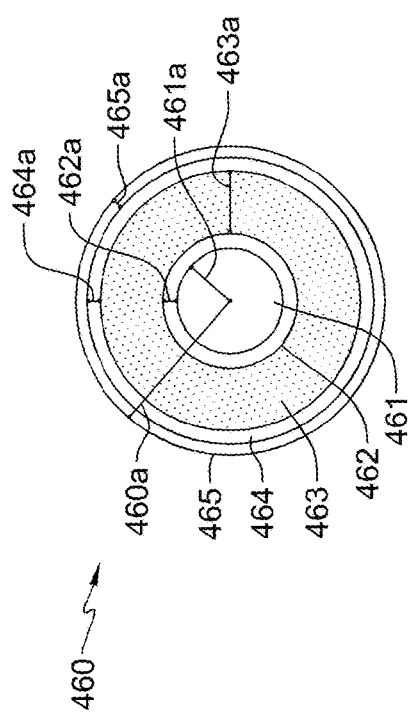
FIG. 4C depicts a cross-section view of a fiber including a multilayer fuel region, in accordance with one or more aspects of the present invention.

FIG. 4C depicts a radial cross-section view through multilayer fuel region 460 of fiber 450 of FIG. 4B, illustrating exemplary thicknesses of the different layers of multilayer fuel region 460. A similar cross-section view and exemplary thicknesses may apply to multilayer fuel region 420 of FIG. 4A. Core region 461 may be a ceramic material filament, such as a silicon carbide filament, with a thickness 461a in a range of about 5 µm to about 10 µm measured radially from the center of core region 461 (resulting in core region 461 having a diameter ranging from about 10 µm to about 20 µm). First inner layer region 463, having the nuclear fuel material, may have a thickness 463a ranging from about 3 µm to about 30 µm or more. Second inner layer region 462, disposed between the nuclear fuel material 463 and the core region 461, may have a thickness 462a ranging from about 0.5 µm to about 1.5 µm or more. Outer layer region 424, encasing the nuclear fuel material of first inner layer region 463, may have a thickness 464a ranging from about 1 µm to about 2 µm. Overcoat layer 465 over multilayer fuel region 460 may have a thickness ranging from about 1 µm to about 2 µm or more, if desired. Overcoat layer 465 may have a similar thickness over portions of fiber 450 that do not have a multilayer fuel region (i.e., portions of the fiber 450 that include portions of core region 461 and overcoat layer 465 applied over core region 461), or may have a greater thickness over such portions of fiber 450. Multilayer fuel region 460 may thus have an overall thickness 460a ranging from about 10 µm to about 22 µm or more, depending on the thicknesses selected for the layers of multilayer fuel region 460, as measured radially from the center of core region 461 to the outer surface of overcoat layer 465.

Figure 4D:
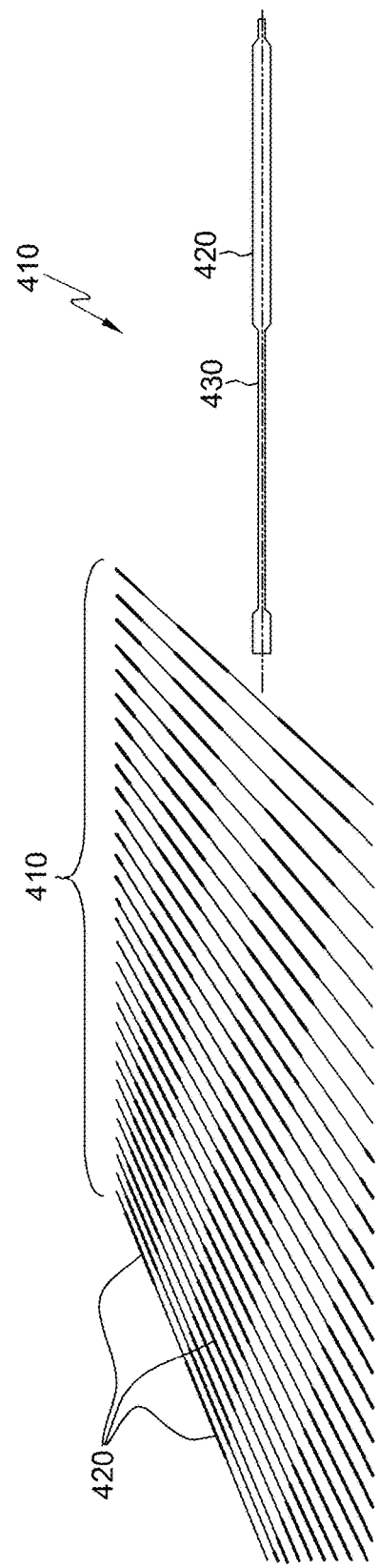
FIG. 4D illustrates one embodiment of a plurality of fibers including a plurality of discrete multilayer fuel regions, or a plurality of scaffolding fibers thereof, in accordance with one or more aspects of the present invention.

FIG. 4D may illustrate one embodiment of a portion of multiple fibers 410, for example multiple scaffold fibers 410 as illustrated, for example, in FIG. 10, and may also illustrate multiple fibers 410 including pluralities of discrete multilayer fuel regions 420, arrayed to form a ribbon or tow that may be wrapped around an inner rod structure of a nuclear fuel structure, as further discussed below and illustrated further in FIG. 5A. For clarity the fiber 410 and multilayer fuel region 420 illustrated in FIG. 4A is shown in FIG. 4D to illustrate clearly the plurality of discrete multilayer fuel regions 420 disposed along fibers 410, with the plurality of discrete multilayer fuel regions 420 separated by non-fuel portions 430 of fibers 410 that do not contain multilayer fuel regions, although it is to be understood that multiple fibers 450 as illustrated in FIG. 4B may similarly be arrayed in a similar ribbon or tow. In exemplary embodiments in which the plurality of discrete multilayer fuel regions 420 are disposed substantially uniformly over a length of fiber 410, any one of the plurality of discrete multilayer fuel regions 420 may, for example, be about 5 mm long, and any one non-fuel portion 430 may, for example, be about 5 mm long. The plurality of discrete multilayer fuel regions 420 may thus cover about half or 50% of an overall length of one fiber of the multiple fibers 410. The length dimensions provided are by way of example only, as the plurality of discrete multilayer fuel regions may be formed to have greater or smaller lengths, and may be separated by larger or smaller non-fuel portions 430 along fiber 410. For example, multilayer fuel regions 420 may be formed to a length of about 6.5 mm, and the non-fuel portions 430 separating the plurality of discrete multilayer fuel regions 420 may be about 3.5 mm in length. In this example, the plurality of discrete multilayer fuel regions 420 may cover about 65% or more of a length of fiber 410.

Figure 5A:
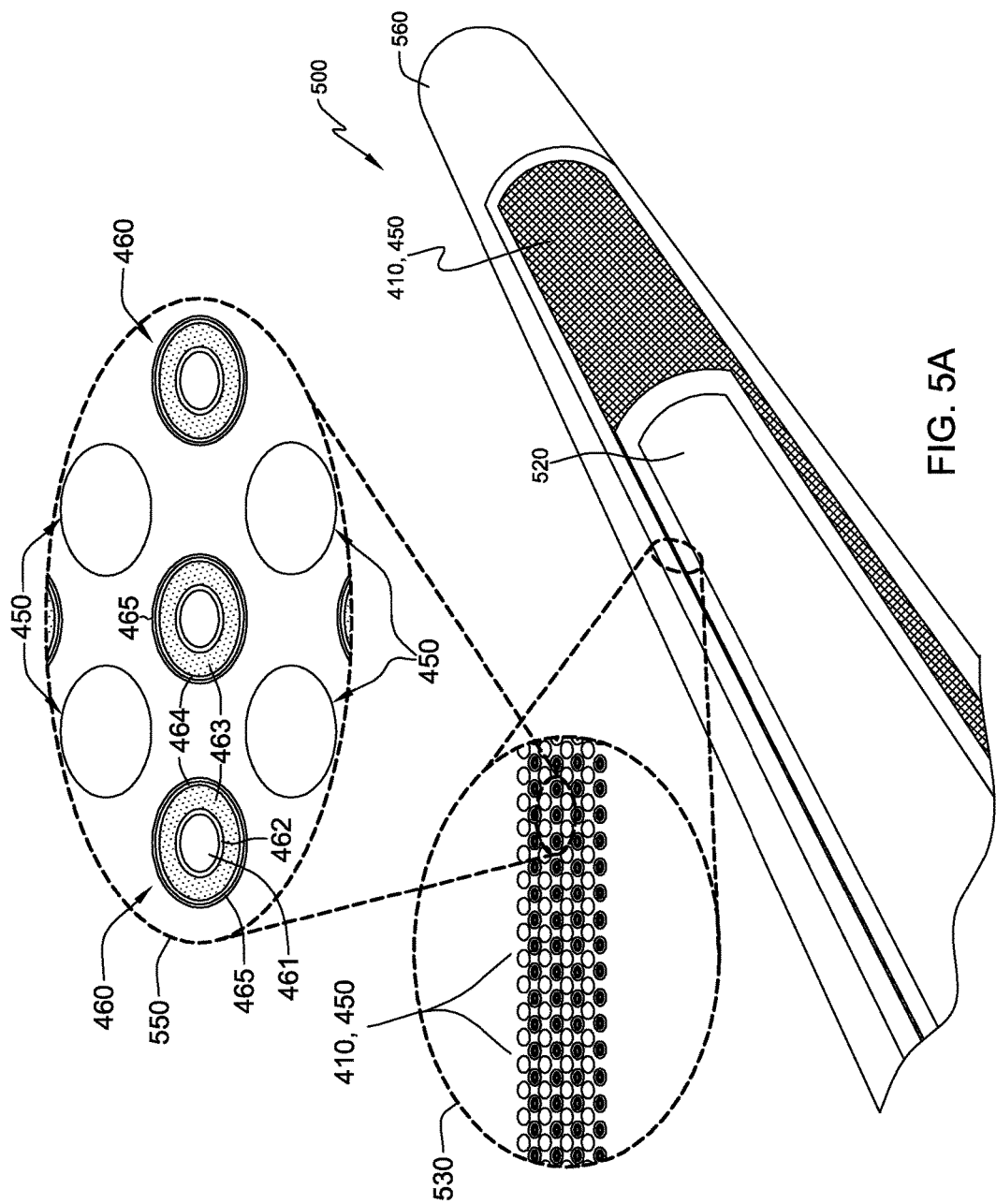
FIG. 5A depicts one embodiment of a portion of a nuclear fuel structure that includes a plurality of fibers that have multiple discrete multilayer fuel regions, and/or nuclear poison regions, in accordance with one or more aspects of the present invention.

FIG. 5A depicts one embodiment of a nuclear fuel structure 500 or cladding structure 500 with a plurality of fibers 410/450, such as in the examples of FIGS. 4A-4B, arranged within nuclear fuel structure 500 or cladding structure 500. Nuclear fuel structure 500 has an inner rod or tube structure 520 and an outer layer 560, similar to structure 300 of FIG. 3B, and the plurality of fibers 410/450 may be arranged to wrap around inner rod or tube structure 520 to facilitate providing structural support to nuclear fuel structure 500. Similar to structure 300 of FIG. 3B, the respective roles of tube 520 and outer layer 560 can be swapped, in which case the plurality of filaments 410/450 are wound inside an outer tube 560 and covered with an inner layer 520 to provide structural support to nuclear fuel structure 500. For clarity and simplicity, the former architecture of inner rod or tube 520 and outer layer 560 is assumed herein below without loss of generality. Hence, multiple fibers 410/450 of the plurality of fibers include pluralities of discrete multilayer fuel regions, similar to multilayer fuel regions 420/460 of FIGS. 4A-4D, as illustrated more clearly in close-up cross-sectional views 530 and 550 of a portion of the plurality of fibers 410/450. Thus, the plurality of fibers 410/450 arranged in nuclear fuel structure 500 or cladding structure 500 may provide both cladding for nuclear fuel pellets and/or provide the nuclear fuel material of nuclear fuel structure 500 and structural reinforcement, or cladding, for nuclear fuel structure 500. The close-up cross-sectional views 530 and 550 show one possible arrangement of segments of fibers without fuel regions alternating with segments of fibers that include multilayer fuel regions 460, as the fibers might appear if one were to cut longitudinally along the fibers wrapped around inner rod structure 520. It may be noted, however, that the alternating pattern depicted in FIG. 5A may not result everywhere in nuclear fuel structure 500, as fibers 410/450 need not be wrapped around inner rod structure 520 so as to produce such a symmetrical, alternating pattern of multilayer fuel regions 460 with non-fuel regions. In practice, a cross-sectional view 530, 550 of fibers 410/450 might have a random pattern of multilayer fuel regions 460 arrayed with non-fuel regions. The exemplary nuclear fuel structure 500 illustrated by FIG. 5A depicts eight layers of fibers 410/450 layered over inner rod or tube structure 520 for illustrative purposes only, and it may be understood that many more layers of fibers 410/450 including multilayer fuel regions may be provided to provide more nuclear fuel within nuclear fuel structure 500 and provide greater structural reinforcement to nuclear fuel structure 500.

Referencing FIGS. 4A-4D and 5A again, fiber 410 or fiber 450 of FIGS. 4A-4B may provide a greater volume of nuclear fuel material for nuclear fuel structure 500 than a volume of nuclear fuel material possible for nuclear fuel rods in current use. The volume of nuclear fuel material that can be packed into nuclear fuel structure 500 may be a matter of volume fraction of the fiber 410/450 that is nuclear fuel, and a volume fraction of fiber 410/450 taken up by the composite (CMC) materials. These are respectively obtained from equations EQ. 1 and EQ. 2 below, where:

$u_{ff}$ and $f_f$ are respectively the fuel volume fraction of the fiber, and the fiber volume fraction of the composite, $d_c$ and f are respectively the fiber core and outer diameters, and d and D the nuclear fuel structure 500 inner and outer diameters, $t_n$ and $t_f$ are the respective thicknesses of the nanoporous carbon and fuel layers, $\delta_i$ and $\delta_o$ are the nuclear fuel structure's respective inner and outer layers of monolithic SiC thicknesses, n is the number of layers in the braid, c is the fraction of fiber length covered by fuel cells, and p is the pitch distance between adjacent filaments in a layer.

$$u_{ff} = 4c \frac{(d_c + t_n + t_f)}{f^2} t_f \quad \text{(EQ. 1)}$$

$$f_f = \frac{n \cdot \pi \cdot (d + \delta_i + \delta_o + n \cdot f)}{(D^2 - d^2)p} \quad \text{(EQ. 2)}$$

For example, consider a fuel embedded in a 30 μm fiber, as shown in the example of FIG. 4C. If it is assumed that the fuel cells to cover 65% of the fiber's length, the volume fraction of the filament occupied by nuclear fuel is 33%. This is over 2.5 times the fuel packing density of TRISO. Similar to TRISO fuel, because the fuel is fully sealed in SiC, the fissile material content can be nearly doubled compared to UO2 by embedding UC, UN, $U_2Si_3$ or even U as nuclear fuel.

Referring again to FIGS. 4A-4D and 5A, the issue of fiber packing density using the fibers described herein may be examined. Table 1 compares alternate designs for fiber volume fraction, and against TRISO for fuel volume fraction for various designs of tube inner diameter ('ID') and outer diameter ('OD'). The analysis also assumes inner and outer monolithic SiC layer 500 μm thick sealing in the CMC tube, and an intra-layer pitch of 40 μm center to center between filaments. Although the embodiments described so far have assumed a tube configuration, alternative embodiments may include braiding over a monolithic SiC rod, which is what design No. 3 in Table 1 represents.

Table 1 shows the superior fiber packing density afforded by the ribbon architecture introduced in FIGS. 3A-3B and 5A, comparing alternate embodiments or designs for fiber volume fraction and fuel volume fraction. Indeed, ceramic tow weaving or braiding seldom can produce fiber volume fractions reaching 30%, which is important for the structural strength and toughness of the CMC. The higher fiber volume fraction is achieved without exacerbating the "labyrinth effect" which typically prevents adequate infiltration by the matrix and results in unwanted voids in the CMC. The implementation suggested by the examples treated in would leave a well-controlled pore distribution of 10 μm between filaments, allowing for even diffusion of the matrix precursors throughout the volume of the CMC.

More importantly for nuclear energy applications, the proposed approach allows fuel packing densities that are up to 3 times as much as TRISO spherical fuel, with the added benefit—assuming a tube—that heat could be convectively extracted from both the inner and outer surfaces, hence enhancing heat transfer. A final, but important remark, is that embodiments including tube designs, such as tube designs 1 and 3 in Table 1 below, could be made as drop-in replacements for Zircaloy fuel rods in light water reactors (LWR).

TABLE 1

Comparing alternate embodiments of a nuclear fuel structure for fiber volume fraction and fuel volume fraction.

| # | ID (in.) | OD (in.) | Layers | Fiber volume fraction | Fuel volume fraction |
|---|---|---|---|---|---|
| Reference | | | TRISO | 32% | 6.5% |
| 1 | ¼ | ½ | 72 | | 10.5% |
| 2 | ½ | 1 | 178 | 49.5% | 16.3% |
| 3 | ⅛ | ½ | 125 | 46.3% | 15.25% |

Referring to FIGS. 5A-5E, through the use of a nuclear fuel structure such as nuclear fuel structure 500 it may be possible to achieve a fuel assembly design for which a fuel volume fraction exceeds an annulus minimum areal fuel load q of about 0.443576. Achieving such a fuel assembly design may be characterized as a paving problem, in which the paving problem may be parameterized as described below.

Figure 5B:
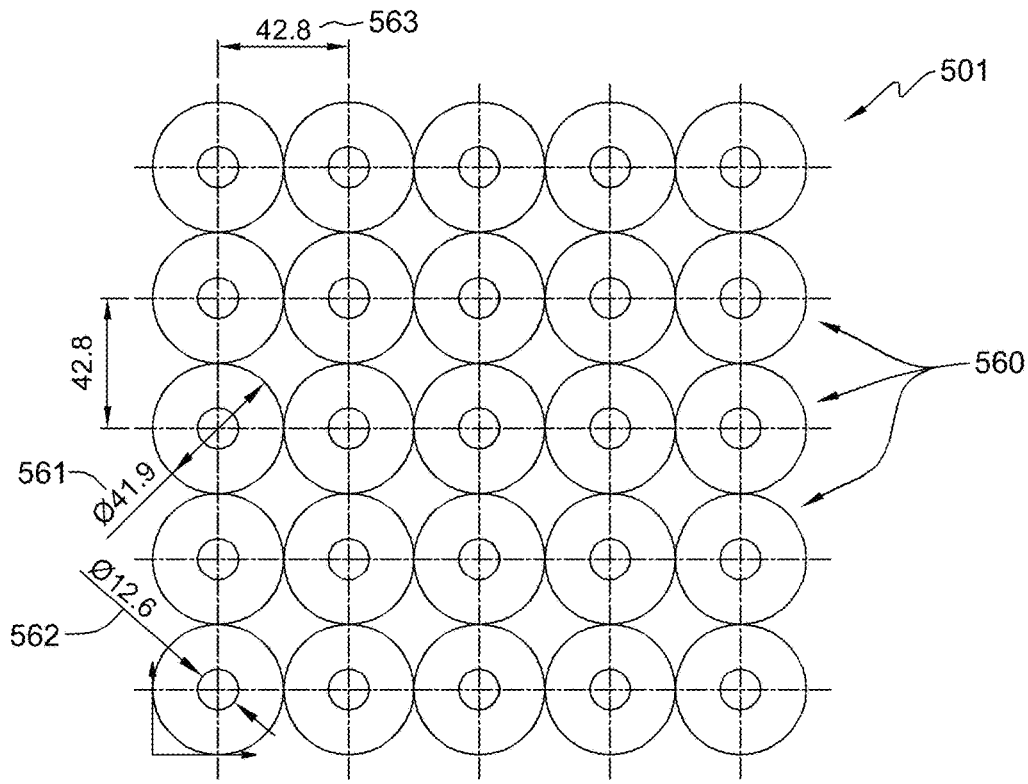
FIGS. 5B-5E depict cross-sectional views of embodiments of nuclear fuel assemblies using the nuclear fuel structure of FIG. 5A, in accordance with one or more aspects of the present invention.

For example, as depicted in part by FIG. 5B, it may be assumed that an integral fuel tube will be in a square pattern with a center-to-center distance m. The inner and outer diameters of the integral fuel tube are d and D respectively and the areal fuel loading in the tube cross-section is q. Further ρ and μ designate respectively:

$$\rho = \frac{D}{m} \quad \text{(EQ. 3)}$$

$$\mu = \frac{d}{D} \quad \text{(EQ. 4)}$$

The paving problem may be reduced to a single tile, with an areal fuel load given by EQ. 5 below:

$$UVF_t = (\pi/4)q\rho^2(1-\mu^2) \qquad \text{(EQ. 5)}$$

EQ. 5 governs the design space of feasible solutions for a fuel assembly. Assuming the fuel assembly is paved with such tiles, then the tile's areal fuel load is the same as that of the FA. FIG. 5B depicts an example cross-section of a fuel assembly 501 including fuel rods 560. For the example 5×5 grid of distributed over a 214 mm×214 mm cross-section of fuel assembly 501, as depicted in FIG. 5B, a center-to-center distance 563 m=42.8 mm. As well, for the example fuel assembly 501, an inner to outer tube diameter ratio $\mu \approx \frac{1}{3}$, so that the tube's wall thickness is of the order of the inner diameter. As an illustrative example, we pick an annulus ID 562 and OD 561 respectively at 12.6 mm and 41.9 mm, i.e. $\rho=0.978$ and $\mu=0.3$.

The tables below show two sample design configurations that exceed the required annulus areal fuel load of q=0.443576. The designs differ only in their constitutive fibers and the corresponding monolithic layer. The fuel assembly areal fuel loads for these designs are 30.88% and 30.44% respectively. Both are greater than a benchmark areal fuel load of 30.36%.

use, a structural breach in the cladding or casing may risk exposing a large amount of the nuclear fuel contained in the fuel rod, and potentially may expose all of the radioactive nuclear fuel to the surrounding environment. Because the nuclear fuel material of nuclear fuel structure 500 is embedded inside the plurality of fibers 410/450 in a plurality of discrete and separated multilayer fuel regions, rather than being deployed inside a tube, any breach in the structure of nuclear fuel structure 500 may only expose a small amount of the total nuclear fuel material, minimizing the amount of hazardous radioactive material that may escape into the surrounding environment in the event of an accident. As well, it may be extremely difficult and extremely dangerous for nuclear fuel material to be recovered from nuclear fuel structure 500 for misuse in making weapons, as the nuclear fuel material in inner layer regions 423 is embedded within carbon and silicon carbide materials and formed over carbon and silicon carbide layers as well. Finally, because nuclear fuel is embedded and sealed within the plurality of fibers before the fibers are wrapped around inner rod structure 420 of the nuclear fuel structure 500, there may be no need to provide a cap to seal nuclear fuel structure 500. This may eliminate problems with trying to fuse a silicon carbide sealing cap to ends of a silicon carbide fuel structure or cladding.

TABLE 2

Comparing alternate design configurations of fuel assembly having annulus arreal fuel load q > 0.443576.

| | | | | | | |
|---|---|---|---|---|---|---|
| Annulus ID | 12.6 | mm | | Annulus ID | 12.6 | mm |
| Annulus OD | 41.9 | mm | | Annulus OD | 41.9 | mm |
| Monolithic Layer | 485. | μm | | Monolithic Layer | 535. | μm |
| Number of Layers | 171 | layers | | Number of Layers | 97 | layers |
| Fiber Core Diameter | 15 | μm | | Fiber Core Diameter | 15 | μm |
| Nanoporous carbon layer thickness | 2.5 | μm | , | Nanoporous carbon layer thickness | 5 | μm |
| Fuel layer thickness | 26 | μm | | Fuel layer thickness | 47.5 | μm |
| Fiber Diameter | 80 | μm | | Fiber Diameter | 140 | μm |
| Pitch | 87.5 | μm | | Pitch | 145 | μm |
| Fiber volume fraction | 0.670533 | % | | Fiber volume fraction | 0.70293 | % |
| Tube Areal Fuel Load | 0.451101 | % | | Tube Areal Fuel Load | 0.444621 | % |

As the share of fuel assembly cross-section functionally allocated to fuel is increased, the share of cross-section allocated to coolant flow may be reduced compared to other fuel assembly designs. The total convective perimeter may also be reduced to 4.28 m, a 45% reduction compared to other designs. This may require a two-fold improvement of convective heat transfer, which can be achieved with a flow increase, an increased operating temperature, or a combination thereof. Fortunately in this case, higher operating temperatures are not only permitted by the material, they are also desirable for thermal efficiency. It is also worth noting that with current fuel pellet-based design, conductive heat transfer is a limiting factor due to the poor thermal conductivity of $UO_2$. Conductive heat transfer is no longer limiting in the case of CMC containing fuel in fibers as conductivity is increased by about two orders of magnitude by the SiC matrix and fibers.

Figure 5C:
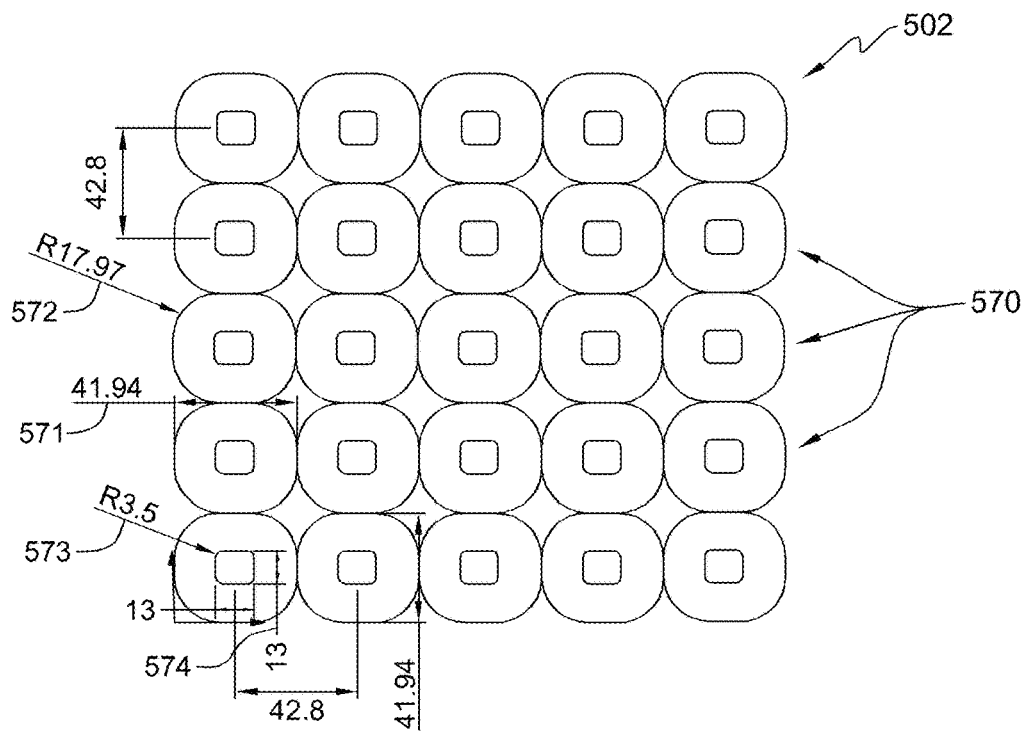
Figure 5D:
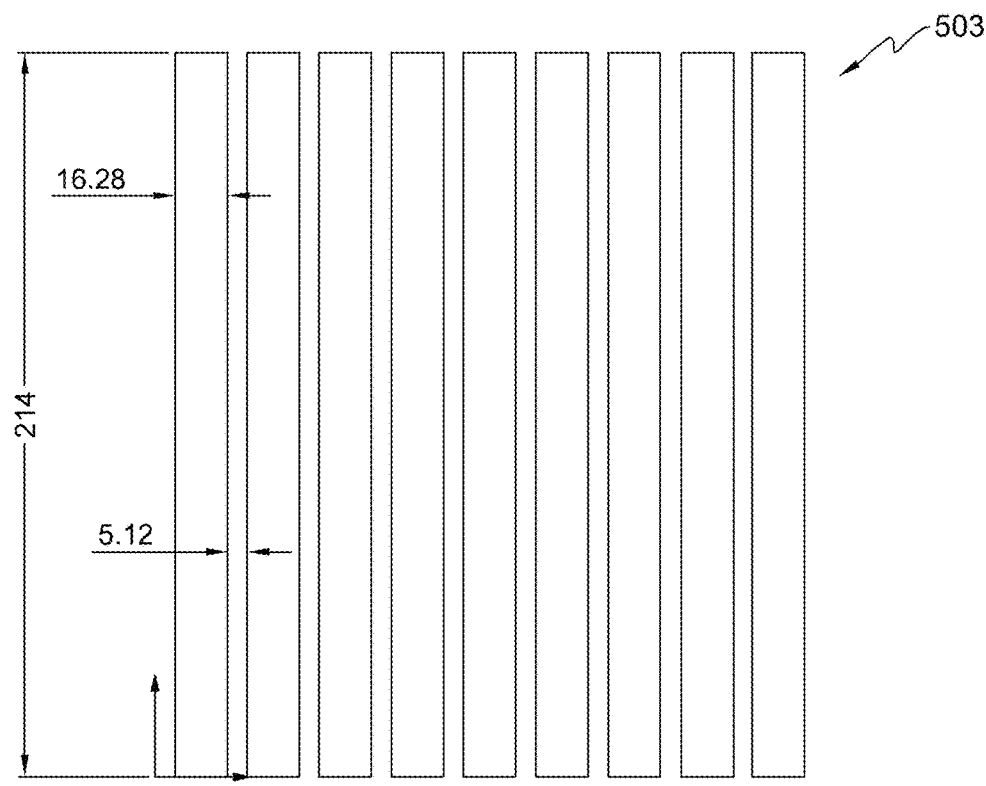
Figure 5E:
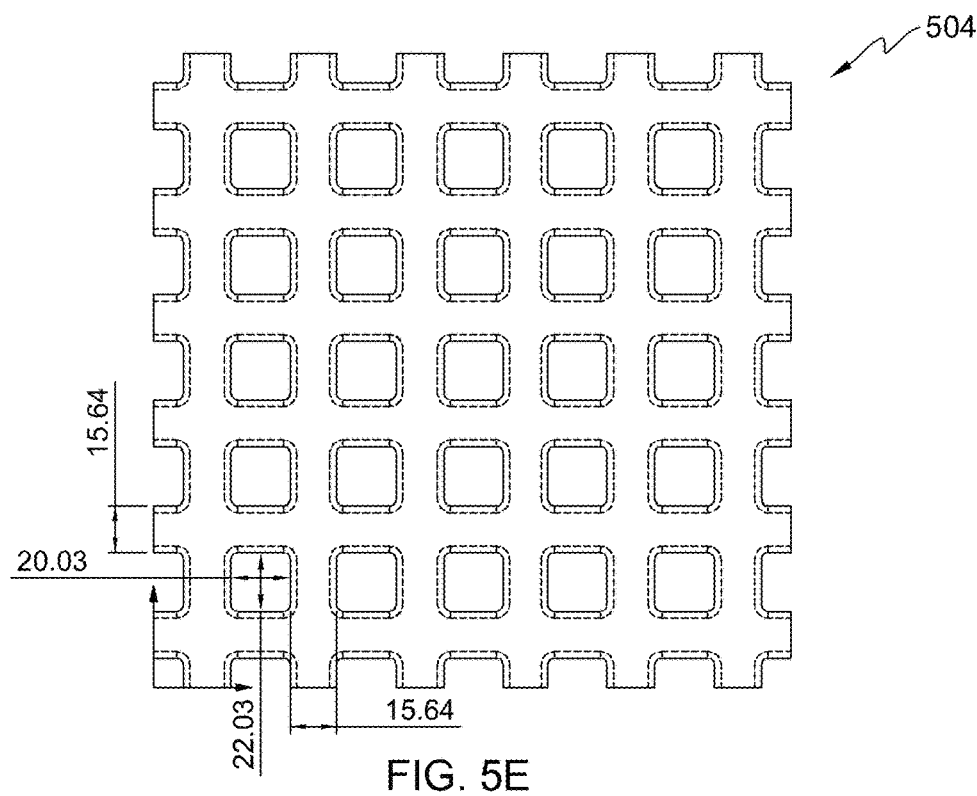

FIGS. 5C-5E depict cross-sectional views of alternative design variants of the fuel assembly depicted in FIG. 5B. The alternative designs depicted by FIGS. 5C-5E may have a similar fuel assembly areal content with different convective perimeters.

Referring again to FIG. 5A, any of the described embodiments of nuclear fuel structure 500, as well as alternative embodiments, may provide several additional benefits in addition to those described above. In fuel rods currently in As well, pure stoichiometric β-SiC fibers are capable of being resistant for long periods of time (>8 years) in close proximity to nuclear fuel. To date, the only SiC fibers to have achieved the required stoichiometry and purity have been deposited by CVD on a tungsten or carbon core filament. Such fibers, however, come only in large diameters (90 or 140 μm) that are unsuitable for the kind of braiding or weaving as disclosed herein, let alone the presence of a foreign core filament that would not necessarily survive the nuclear reactor environment.

As discussed previously, a source of $SiC_f$ tows approaching stoichiometry and purity is HNS. There are two issues of critical import associated with HNS: Composition, and foreign sourcing. HNS fibers are produced by spinning a preceramic polymer, which must then be processed at great expense of money and energy to reduce impurity levels. These extreme levels of processing drive the cost of HNS to roughly $10,000/lb. yet only reduce oxygen contents down to 0.2-0.7%, which is barely acceptable for long-lived nuclear applications. The limitation on oxygen content is inherent to chemical processes that only achieve purity in the limit. It is therefore likely to recur with any preceramic polymer approach to SiC.

The issue of foreign sourcing has also long been a frustration to the US government and industry. As disclosed herein, a CVD process is capable of producing a wide range of filament diameters (10-100 μm), without the requirement of a core filament. The nuclear fuel structures and processes for making such may include printing 3C-βSiC filaments that exhibit stoichiometry and purity in a single step, and that may not require foreign sourcing.

Referring again to FIG. 5A, in one alternative embodiment the plurality of fibers 410/450 may also include multiple sensor fibers. The multiple sensor fibers may be arranged with the multiple fibers including the plurality of discrete multilayer fuel regions. Sensor fibers may include, for example, silicon carbide filaments coated with zirconium diboride ($ZrB_2$), and may include, as another example, silicon carbide filaments coated with hafnium diboride ($HfB_2$). In one embodiment, multiple zirconium diboride coated fibers may be braided with multiple hafnium diboride coated fibers, wherein each overlap or contact point between a zirconium diboride fiber and a hafnium diboride fiber provides a high temperature thermocouple. The resulting braid would form a square matrix of embedded thermal receptors capable of mapping temperature throughout the structure. In exemplary embodiments the boron of the zirconium diboride and hafnium diboride includes the $^{11}B$ isotope to ensure that the fibers may be compatible with nuclear reactors.

Figure 6A:
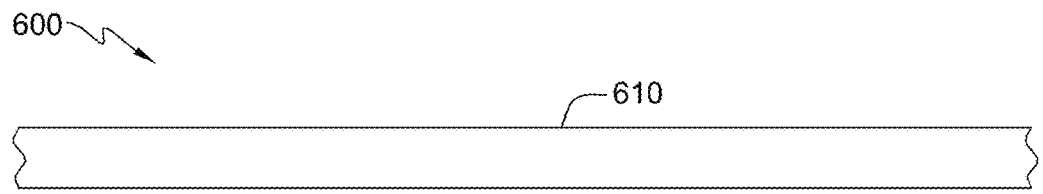
FIGS. 6A-6E depict a process for facilitating fabricating a fiber with a multilayer fuel region, in accordance with one or more aspects of the present invention.

FIGS. 6A-6E depict one example of a part of a process for forming a nuclear fuel structure, such as nuclear fuel structure 500, including forming a multilayer fuel region within at least one fiber of a plurality of fibers. The process depicted in FIGS. 6A-6E may be described as forming a multilayer fuel region by spot-coating, or depositing a layer of material of a specified thickness over a given length of the at least one fiber. FIG. 6A depicts a portion of a fiber 600 including a core filament 610. Core filament 610 may be a core region, as described above, and may include a ceramic material such as silicon carbide or hafnium carbide. In the example depicted in FIG. 6A, core filament 610 may have a substantially uniform thickness.

Figure 6B:
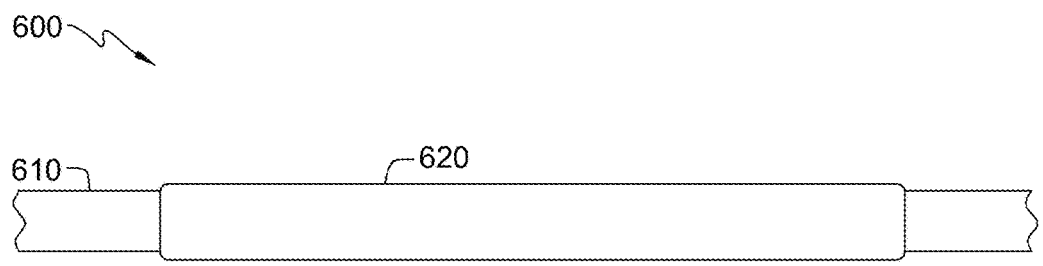

FIG. 6B depicts core filament 610 of FIG. 6A having a material layer 620 deposited over a portion of core filament 610, where material layer 620 includes a material selected to absorb gaseous by-products of nuclear fission reactions occurring in a nuclear fuel material. Material layer 620 may correspond to a second inner layer region 422 depicted in the example of FIG. 4A. In exemplary embodiments material layer 620 may include nanoporous carbon. A material layer 620 of nanoporous carbon may be provided, for example, by chlorine etching of a part of core filament 610. Alternatively, a material layer 620 of nanoporous carbon may be spot-coated onto core filament 610.

Figure 6C:
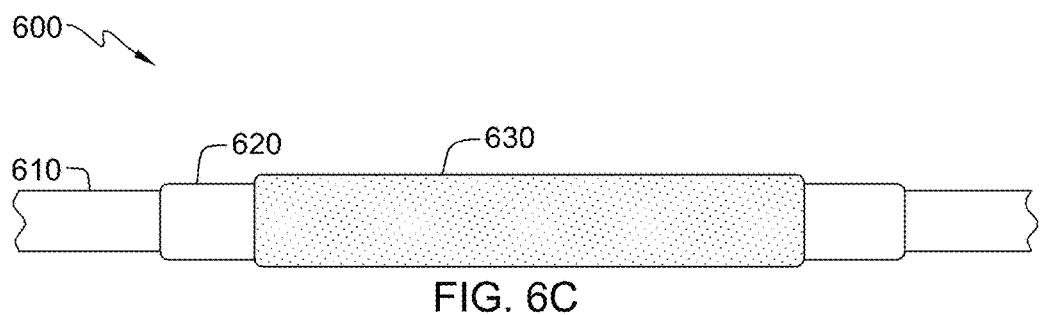

FIG. 6C depicts fiber 600 of FIG. 6B with a nuclear fuel material 630 deposited over at least a part of a length of material layer 620. Nuclear fuel material may include one or more fissile materials such as uranium, plutonium and/or related compounds, for example uranium dioxide, uranium mononitride, uranium carbide, and/or uranium silicide. Nuclear fuel material 630 may be provided, for example, by an LCVD process using, for example, uranium hexafluoride ($UF_6$) as a precursor for forming the nuclear fuel material layer. Alternatively, uranium hexafluoride ($UF_6$) may be used as a precursor for LCVD along with appropriate precursors such as ammonia, methane or chorosilane for the formation of a UN, UC or $U_2Si_3$ layer 630. Nuclear fuel material 630 in FIG. 6C may correspond to a first inner layer region 423 of FIG. 4A.

Figure 6D:
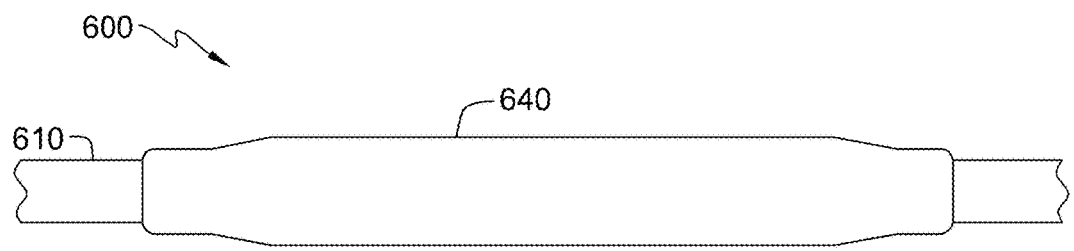

FIG. 6D depicts fiber 600 of FIG. 6C with an outer layer region 640 deposited over nuclear fuel material 630 and material layer 620 of FIG. 4C. In exemplary embodiments, outer layer region 640 encases nuclear fuel material 630 to seal the nuclear fuel within fiber 600. Outer layer region 640 may include, for example, pyrolytic carbon deposited by, in one instance, an LCVD process. Outer layer region 640 and inner layer region 630 including the nuclear fuel material, at least, form a multilayer fuel region of fiber 600.

In one embodiment, outer layer region 640 may be a first outer layer region 640, and a second outer layer region may be included. Second outer layer region may be added to add further functionality to fiber 600. For example, a second outer layer region may include a nuclear poison material, such as boron or gadolinium, that may delay activity of the nuclear fuel material of inner layer region 630. Second outer layer region, in another example, may include a material, such as carbon, that acts as a moderator of nuclear fission activity of the nuclear fuel material 630. In another example, second outer layer region may include an interphase layer for structural integration with a SiC matrix.

Figure 6E:
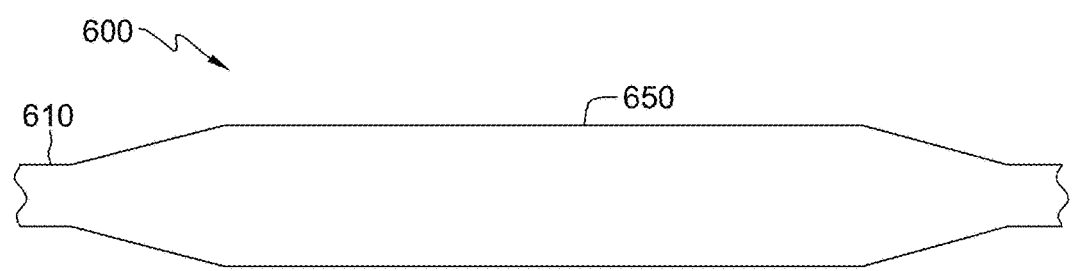

FIG. 6E depicts fiber 600 of FIG. 6D with an overcoat layer 650 deposited over fiber 600, covering both core filament 610 and the multilayer fuel region. Overcoat layer 650 may be provided, for example, by an LCVD process. In the example embodiment illustrated by FIG. 6E, overcoat layer 650 may have a substantially uniform thickness over fiber 600, resulting in the multilayer fuel region having a "beaded" appearance, as shown. In an alternative embodiment, overcoat layer may be formed to have a variable thickness over fiber 600, which may result in greater deposition of overcoat layer 650 over core filament 610 and lesser deposition of overcoat layer 650 over the multilayer fuel region. In such an alternative embodiment, the resulting fiber 600 may have a uniform appearance, as depicted in FIG. 7E.

Figure 7A:
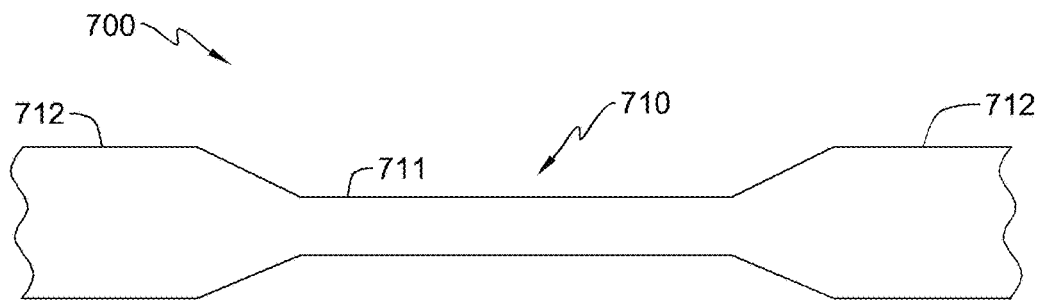
FIGS. 7A-7E depict another process for facilitating fabricating a fiber with a multilayer fuel region, in accordance with one or more aspects of the present invention.
Figure 7B:
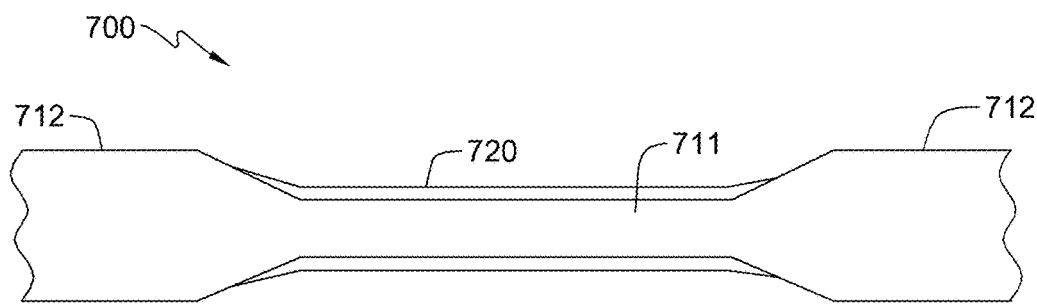
Figure 7C:
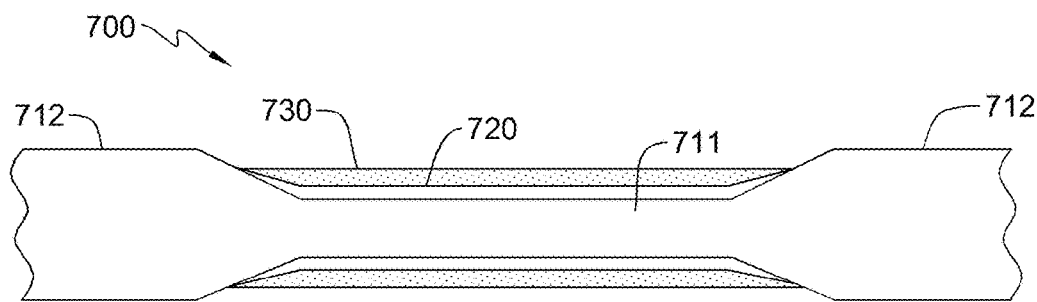
Figure 7D:
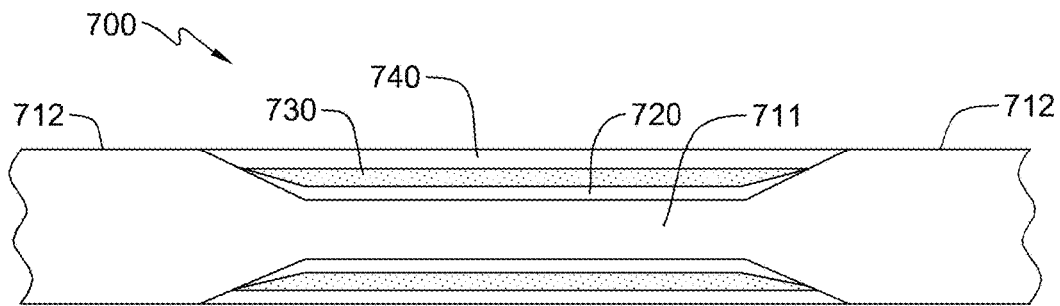
Figure 7E:
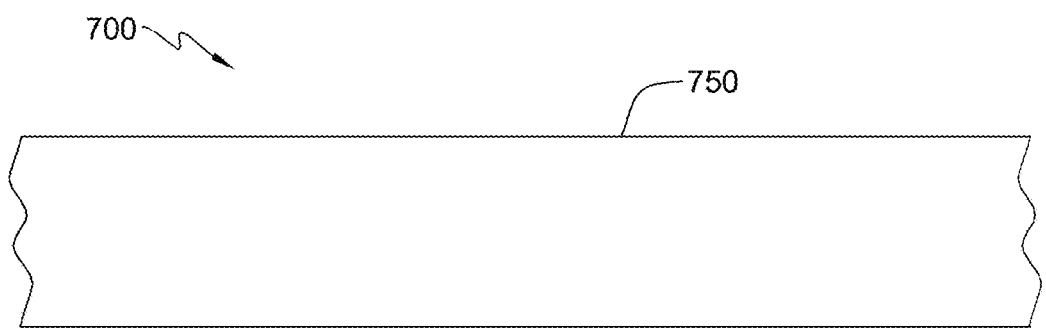

FIGS. 7A-7E depict an alternative embodiment of the process illustrated by FIGS. 6A-6E, in which core filament 710 of fiber 700, as shown in FIG. 7A, has a variable thickness over a length of fiber 700. For example, core filament 710 may have a smaller thickness over first portions 711 of core filament 710, and greater thickness 712 over second portions 712 of core filament 710. As illustrated in FIGS. 7B-7E, the layers of a multilayer fuel region may be formed over first portions 711 so that the multilayer fuel region, as finally formed, has a thickness substantially equal to the thickness of second portions 712.

FIG. 7B depicts core filament 710 of FIG. 7A having a material layer 720 deposited over first portion 711 of core filament 710, where material layer 720 includes a material selected to absorb by-products of nuclear fission reactions occurring in a nuclear fuel material. Material layer 720 may correspond to second inner layer region 462 as depicted in the example of FIG. 4B. In exemplary embodiments material layer 720 may include nanoporous carbon. A material layer 720 of nanoporous carbon may be provided, for example, by chlorine etching of a part of core filament 710. Alternatively, a material layer 720 of nanoporous carbon may be provided by spot-coating.

FIG. 7C depicts fiber 700 of FIG. 7B with a nuclear fuel material 730 deposited over material layer 720. Nuclear fuel material may include one or more fissile materials such as uranium, plutonium and/or related compounds, for example uranium dioxide, uranium mononitride, uranium carbide, and/or uranium silicide. Nuclear fuel material 730 may be provided, for example, by an LCVD process. Nuclear fuel material 630 may be provided by an LCVD process using, for example, uranium hexafluoride ($UF_6$) as a precursor for forming the nuclear fuel material layer. Alternatively, uranium hexafluoride ($UF_6$) may be used as a precursor for LCVD along with appropriate precursors such as ammonia, methane or chorosilane for the formation of a UN, UC or U$_2$Si$_3$ layer 730. Nuclear fuel material 730 of FIG. 7C may correspond to inner layer region 463 of FIG. 4B.

FIG. 7D depicts fiber 700 of FIG. 7C with an outer layer region 740 deposited over nuclear fuel material 730 and material layer 720 of FIG. 7C. In exemplary embodiments, outer layer region 740 encases nuclear fuel material 730 to seal the nuclear fuel within fiber 700. Outer layer region may include, for example, pyrolytic carbon deposited by, in one instance, an LCVD process. Outer layer region 740 and inner layer region 730 including the nuclear fuel material, at least, form a multilayer fuel region of fiber 700. Multilayer fuel region of fiber 700 may now have a thickness substantially equal to the thickness of second portions 712 of core filament 710.

In one embodiment, outer layer region 740 may be a first outer layer region 740, and a second outer layer region may be included. Second outer layer region may be added to add further functionality to fiber 700. For example, a second outer layer region may include a nuclear poison material, such as boron or gadolinium, that may delay activity of the nuclear fuel material of inner layer region 730. Second outer layer region, in another example, may include a material, such as carbon, that acts as a moderator of nuclear fission activity of the nuclear fuel material 730. In another example, second outer layer region may include an interphase layer for structural integration with a SiC matrix.

FIG. 7E depicts fiber 700 of FIG. 7D with an overcoat layer 750 deposited over fiber 700, covering both core filament 710 and the multilayer fuel region. Overcoat layer 750 may be provided, for example, by an LCVD process. The resulting fiber 700 may have a substantially uniform thickness over a length of fiber 700 following provision of overcoat layer 750. Multilayer fuel region of fiber 700 may thus be embedded within fiber 700.

Figure 8:
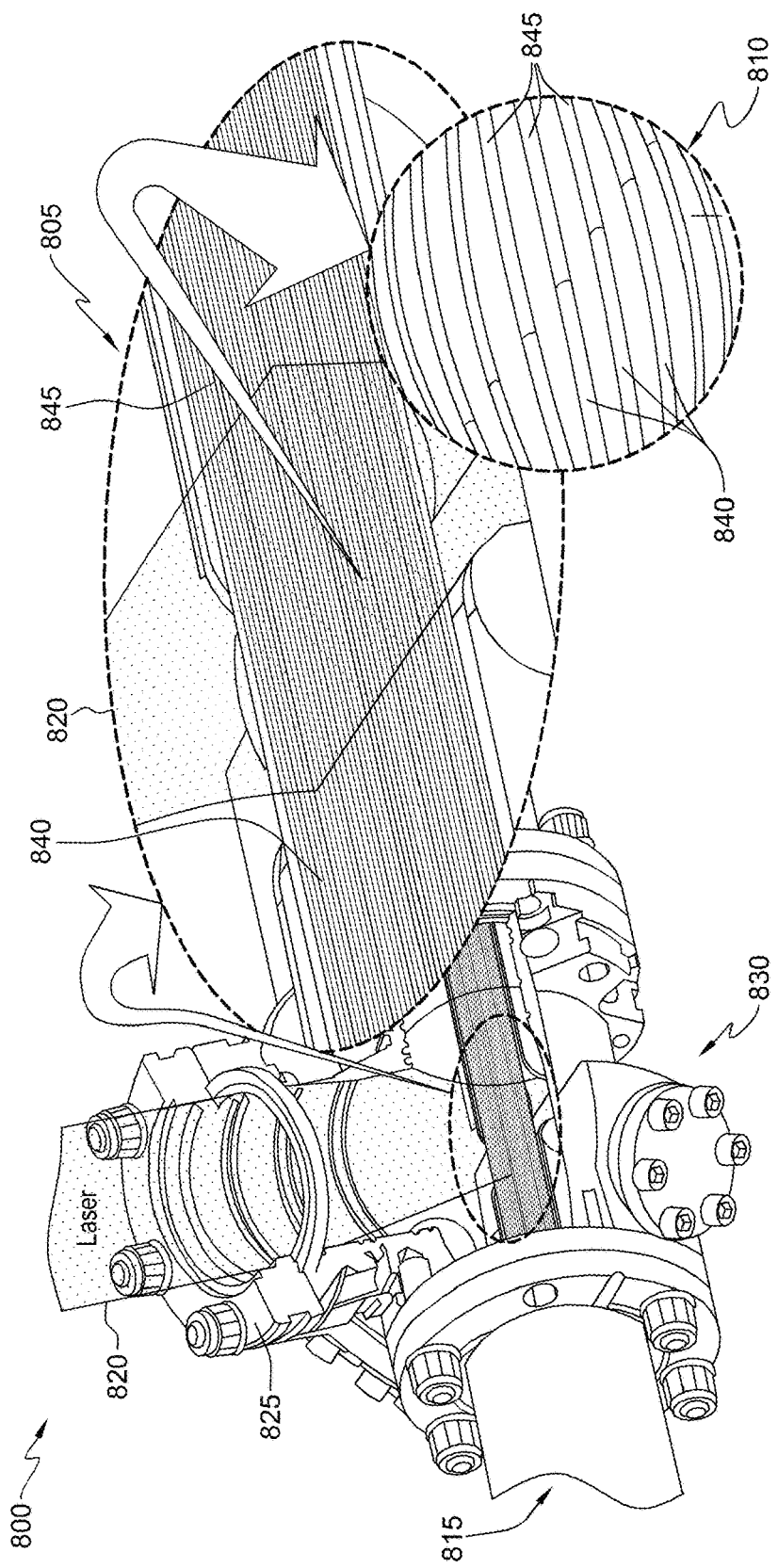
FIG. 8 depicts one embodiment of an apparatus for facilitating fabricating a plurality of fibers having multiple discrete fuel regions, in accordance with one or more aspects of the present invention.

The embodiments of the processes depicted in FIGS. 6A-6E and FIGS. 7A-7E may not only be applied to one fiber, but may be applied to multiple fibers arrayed together in a ribbon or tow-like structure, so that each layer of a multilayer fuel region for one fiber is also formed over the other multiple fibers, as shown in FIG. 8. Each step of layer formation may be carried out in a separate deposition tool, an example of which is depicted in FIG. 8, and the multiple fibers may be conveyed from one deposition tool to the next for the next layer to be deposited. As well, the deposition tool or tools may be controlled to automatically stop and start deposition of layers over the multiple fibers, thus allowing for a plurality of discrete multilayer fuel regions to be formed along the lengths of the multiple fibers while also automatically forming non-fuel regions of the fiber that separate the plurality of discrete multilayer fuel regions.

FIG. 8 depicts one example of a deposition tool 800 that may be used to form a layer of a multilayer fuel region of at least one fiber, or respective layers of respective multilayer fuel regions for a plurality of fibers. Deposition tool 800 may, for example, be a laser chemical vapor deposition (LCVD) tool. Deposition tool 800 may convey multiple fibers 830 through a conveyer inlet 815 into a deposition chamber 830. Deposition chamber may contain one or more precursor gases that may facilitate forming a layer of a multilayer fuel region. A laser 820 may be provided, through a focusing lens or window 825, to be incident on multiple fibers 840 as the multiple fibers are conveyed through the deposition chamber. As the laser 820 interacts with the multiple fibers 840 and precursor gases, the desired layer of a multilayer fuel region may be deposited over portions of the multiple fibers 845. In one example, the laser may be started and stopped at defined intervals as the multiple fibers pass through the deposition tool 800, thus controlling formation of multilayer fuel regions over portions of the multiple fibers 845 and leaving other portions unprocessed (i.e., non-fuel regions of the multiple fibers). The processed multiple fibers 845 may then be conveyed out of the deposition tool 800. The multiple fibers 845 may then be conveyed to another deposition tool, in which another layer of the discrete multilayer fuel regions will be formed, or may be finished and conveyed out of the tool entirely. The resulting multiple fibers may then be further arranged in a nuclear fuel structure, such as nuclear fuel structure 500, to be wrapped around an inner rod structure, as described herein. For clarity, FIG. 8 includes close-up views 810 and 815 of the multiple fibers 840, 845 as the multiple fibers undergo LCVD processing to deposit a layer of the multilayer fuel regions.

Figure 9:
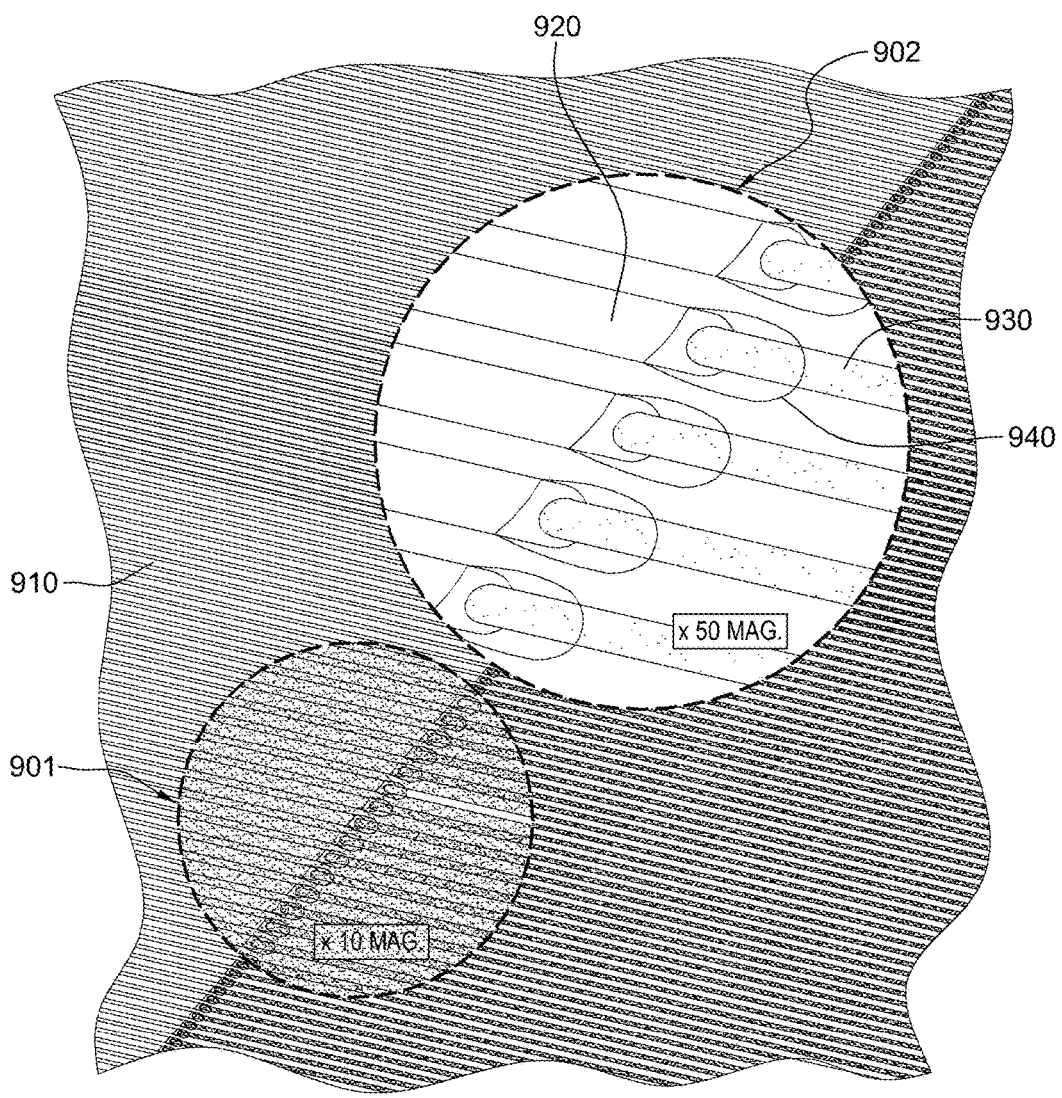
FIG. 9 depicts one embodiment of a process for forming a plurality of fibers, in accordance with one or more aspects of the present invention.

FIG. 9 depicts one embodiment of a process 900 for forming a plurality of fibers arranged in a lattice 910. Magnified views 901 and 902 depict a filament lattice 910 including a plurality of filaments 920 undergoing treatment by a plurality of laser beams 930 in a LCVD process. Plurality of laser beams 930 induce a plasma 940 around a tip of the plurality of filaments 920, adding material to the plurality of filaments 920 to form the plurality of fibers. The plurality of fibers may, in turn, be the plurality of fibers depicted in any of FIGS. 3A-8, as described above. The LCVD process of FIG. 9 may, in one example, be controlled to form a plurality of fibers having a substantially uniform thickness. In another example, the LCVD process of FIG. 9 may be variably controlled to form a plurality of fibers having variable thickness along the lengths of the plurality of fibers. For example, the plurality of laser beams 930 may have an intensity that may be increased or decreased as the plurality of fibers are formed, resulting in corresponding increases or decreases in the amount of material added to the plurality of filaments 920 of filament lattice 900. Depicted in FIG. 9 is one exemplary method and apparatus for forming a plurality of fibers from (e.g., CVD) precursors, including a reactor adapted to grow a plurality of individual fibers; and a plurality of independently controllable lasers, each laser of the plurality of lasers growing a respective fiber of the plurality of fibers. The reactor and lasers may grow the fibers according to Laser Induced Chemical Vapor Deposition. The plurality of lasers in one embodiment comprises Quantum Well Intermixing (QWI) lasers. This technique is further discussed in PCT Publication WO2013180764 (A1) dated 2013 Dec. 5, entitled "HIGH STRENGTH CERAMIC FIBERS AND METHODS OF FABRICATION", filed as PCT Application WO2013US22053 20130118; and the following three (3) previously filed U.S. Provisional Patent Applications: U.S. Provisional Application No. 61/588,733, filed Jan. 20, 2012, entitled "METHOD AND APPARATUS FOR LARGE SCALE MANUFACTURING OF HIGH STRENGTH CERAMIC FIBERS USING A PLURALITY OF CONTROLLABLE LASERS"; U.S. Provisional Application No. 61/588,765, filed Jan. 20, 2012, entitled "NON-BRIDGING IN-SITU BORON NITRIDE COATING OF SILICON CARBIDE FIBERS IN CERAMIC MATRIX COMPOSITE MATERIALS"; and U.S. Provisional Application No. 61/588,788, filed Jan. 20, 2012, entitled "NANO-COATING SYSTEMS FOR HIGH PERFORMANCE FIBERS FOR DIRECTING MICRO-CRACKS AND ENDOWING MATRIX COMPOSITES WITH AN IMMUNE RESPONSE TO MICRO-CRACKING AND OXIDATION". Each of the above-noted PCT and provisional applications is hereby incorporated herein by reference in its entirety.

Figure 10:
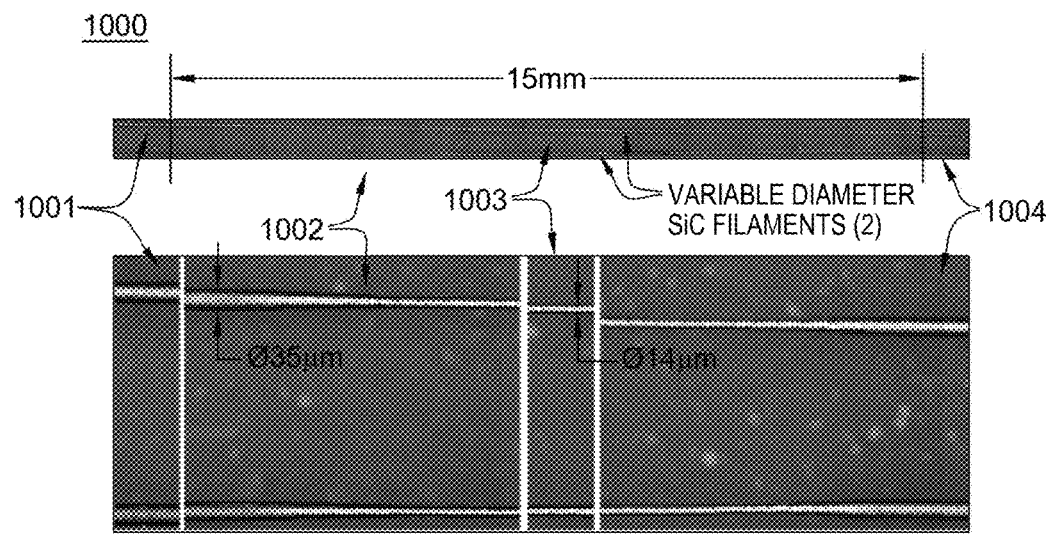
FIG. 10 depicts one embodiment of a plurality of scaffolding fibers that may be formed by a digital spinneret technology, in accordance with one or more aspects of the present invention.

FIG. 10 depicts an exemplary embodiment of the plurality of filaments of FIG. 9 in lattice 910 resulting from variation in the laser power of laser beams 930. The filament section 1001 produced at the highest level of laser power has the largest thickness. As laser power decreases smoothly over the section of filament 1002, ending with section 1003. As laser power increases back up, so does filament thickness until it maxes out in section 1004.

Alternatively, the plurality of fibers may be formed by using "Digital Spinneret" ("DS"). This technology may also be known as a 'Fiber Laser Printer.' The DS technology induces the growth of parallel monofilaments by massive parallelization of Laser Induced Chemical Vapor Deposition ("LCVD"), similar to the technique depicted in FIG. 9, in which laser incidence occurs at a glancing angle to a substrate. One example embodiment of a $SiC_f$ ribbon 910 that may be produced by this method is shown in FIG. 10. The resulting filaments may be β-SiC 3C with grain size distribution varying from the fiber center outward. Grains at the edge of the fiber are equiaxed. The anisotropy of the laser printing process manifests itself at the fiber's center where grains are elongated along the fiber's axis, and present an aspect ratio of 2-3 or more, with a radial size of about 25 nm or more. The grain distribution may provide additional toughness.

Any one or more of the nuclear fuel structures 500 disclosed herein may not only be appropriate for use in existing nuclear reactors, and may substitute directly for metal alloy cladding fuel rods, but may also be appropriate for use in nuclear thermal propulsion (NTP) applications. Nuclear thermal propulsion (NTP) has been a technical area of interest for the United States federal government and NASA since the late 1950's. Nuclear fuel structures 500 may offer several advantages for harnessing nuclear fission in a spacecraft engine, and may provide a nuclear fuel structure design equivalent to a hexagonal fuel element building block as developed by the Nuclear Engine for Rocket Vehicle Applications (NERVA) program. The following NERVA engineering parameters may be applied to determine a fuel-in-fiber system using a nuclear fuel structure such as nuclear fuel structure 500: a) uranium fuel density 600 mg/cc; b) hexagonal element leg length 0.753"; c) 19 nozzles equivalent to 19 channels found in hexagonal element.

The resulting silicon carbide-silicon carbide (SiC—SiC) nozzle geometry would utilize a notional 2 millimeter (mm) inner diameter/4 mm outer diameter SiC monolithic tube mandrel and require 2 meters of fibber ribbon per inch of tube. The fiber volume fraction from this design would be 30%. With micro-encapsulated fuel cells covering 50% of the fiber's length, the fiber fuel content would be 13.4% and thus equivalent to the NERVA hexagonal fuel. The ribbon-wound mandrel structure would subsequently be infiltrated with a SiC matrix by either the chemical vapor infiltration or the polymer impregnation and pyrolysis process. In this manner, the $SiC_f$—$SiC_m$ fuel-in-fiber composite nozzle structure would be fabricated. An interesting variation on the fuel layer composition would be to deposit thorium ($^{232}$Th) as a fertile material for subsequent neutron activation and transmutation to a fissile uranium species ($^{233}$U).

There may be multiple advantages of using a nuclear fuel structure 500 for deployment in NTP. These may include the following:

1) Manufacturing ease—the LCVD additive manufacturing approach can produce a full fuel-in-fiber structure in-situ without the necessity of additional post-fabrication processing. There are multiple levels of economic savings possible via this method. An LCVD deposition system, as disclosed herein, is relatively straightforward, easily scalable, and is composed of significantly less expensive equipment than other CVD and additive manufacturing processes, thus reducing the capital outlay requirements to establish a high throughput manufacturing plant. The operational costs for running and maintaining such fiber production systems are similarly less expensive, including the outlays for raw materials and consumables.

2) Operational temperature range capability—the high purity materials deposited in the baseline fiber and overcoat layers, in particular the lack of oxygen and other detrimental contaminants in the structure, will be able to survive the 2600K operating temperature requirements for a NTP engine.

3) Favorable SiC thermal conductivity—the relatively high thermal conductivity of SiC enhances the ability to remove the heat generated by the fission process occurring in the fuel layers along the fiber length. SiC thermal conductivity values generally range in the 100-150 Watts/meter-K at room temperature, falling to 20-30 W/m-K at temperatures greater than 1500 C. The concept of a $SiC_f$—$SiC_m$ composite nozzle with high heat transfer efficiency could find application in the NERVA NTP engine concept. Fuel-in-fiber wound SiC nozzles would be located in bored passages through the graphite (or other material) block in which $H_2$ propellant travels through the tube inner diameter and is heated.

4) Capture of fission gas by-products—the nano-porous carbon layer adjacent to the deposited fuel layer in the fuel-in-fiber design may serve as a tortuous path medium that effectively traps the fission gas by-products, thus preventing these materials' release into the propellant stream.

5) Utilization of uranium nitride (UN) fuel—the overall integrated fuel package of a $SiC_f$—$SiC_m$ nozzle would provide a barrier to exposure of a UN fuel layer to $H_2$ propellant, thus minimizing the chemical attack and degradation of this fuel material. The advantages of UN fuel include higher uranium fuel density, significantly higher melting point (approaching 3000K at 1 atm) and enhanced thermal conductivity (approximately 20 W/m-K).

6) Safety enhancements—the issue of nuclear fuel safety is obviously a central concern for implementation of NTP technology that needs to be addressed to the satisfaction of government regulators and the general population. Three example safety considerations are:
   a. Accident/crash tolerance in which the integrity of the fuel encapsulation is maintained. The nuclear fuel structure 500 described herein would lead to enhanced protection because the fuel component is enclosed in a multitude of physically isolated microcells protected by outer coating layer(s) and embedded in a solid matrix. Should a fracture develop, only a minute fraction of the cells can be breached, hence greatly limiting the release of fissile material in case of a crash.

b. From the NERVA program, a major issue arose as fissile material was ejected into the propellant stream during testing due to hydrogen gas etching of the graphite block with $UO_2$ or $UC_2$ particles. This chemical attack and material release would be mitigated due to the structure of the nozzle as well as having the nozzles embedded in a solid graphite matrix.

c. For nozzles prepared with fertile nuclear material rather than fissile, the risks of diversion for WMDs is greatly diminished, and unused tubes will not represent a high-level nuclear waste.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A nuclear fuel structure comprising:
   a plurality of fibers wrapping in the structure over a surface of a support element of the nuclear fuel structure to, at least in part, provide structural reinforcement to at least a portion of the nuclear fuel structure;
   a multilayer fuel region formed within least one fiber of the plurality of fibers, the multilayer fuel region comprising:
      an inner layer region comprising a nuclear fuel material; and
      an outer layer region encasing the nuclear fuel material.

2. The structure of claim 1, wherein the nuclear fuel material comprises a fissile material, the fissile material comprising one or more of uranium, uranium mononitride, uranium carbide, and/or uranium silicide.

3. The structure of claim 1, wherein the support element of the nuclear fuel structure comprises an inner rod structure, and wherein the plurality of fibers are arranged to wrap around the inner rod structure and facilitate providing the structural reinforcement.

4. The structure of claim 1, wherein the support element of the nuclear fuel structure comprises an outer tube structure and wherein the plurality of fibers are arranged to wrap inside the outer tube structure and facilitate providing the structural reinforcement.

5. The structure of claim 1, wherein the inner layer region comprising the nuclear fuel material is a first inner region, and the structure further comprises a second inner layer region covered by the first inner layer region, the second inner layer region comprising a material to capture by-products of nuclear fission reactions occurring in the nuclear fuel material.

6. The structure of claim 5, wherein the second inner layer region comprises a nanoporous carbon material.

7. The structure of claim 1, wherein the outer layer region encasing the nuclear fuel comprises pyrolytic carbon and/or silicon carbide.

8. The structure of claim 1, wherein the outer layer region is a first outer layer region, and the structure further comprises a second outer layer region, the second outer layer region comprising a material to inhibit or moderate nuclear fission reactions occurring in the nuclear fuel material.

9. The structure of claim 8, wherein the material of the second outer layer region inhibits nuclear fission reactions, and the material comprises one or more of boron, gadolinium, or hafnium.

10. The structure of claim 1, wherein the multilayer fuel region is one multilayer fuel region of a plurality of discrete multilayer fuel regions disposed along the at least one fiber of the plurality of fibers, the plurality of discrete multilayer fuel regions comprising a respective inner layer region comprising the nuclear fuel material and a respective outer layer region encasing the nuclear fuel material.

11. The structure of claim 10, further comprising an inner core region within the at least one of the fibers over which the plurality of discrete multilayer fuel regions are disposed.

12. The structure of claim 11, wherein the core region comprises a ceramic material.

13. The structure of claim 11, further comprising an overcoat layer along the at least one of the fibers, the overcoat layer further encasing the plurality of discrete multilayer fuel regions and the core region.

14. The structure of claim 13, wherein the overcoat layer comprises a plurality of overcoat layers.

15. The structure of claim 14, wherein at least one additional overcoat layer of the plurality of overcoat layers comprises a material to inhibit nuclear fission reactions occurring in the nuclear fuel material.

16. The structure of claim 10, wherein the respective inner layer regions of the plurality of discrete multilayer layer regions comprise at least 33% of a volume of at least one fiber of the plurality of fibers.

17. The structure of claim 10, wherein the at least one fiber is one fiber of multiple fibers comprising pluralities of discrete multilayer fuel regions, the multiple fibers being at least a subset of the plurality of fibers, wherein the multiple fibers comprise at least 30% of a volume of the structure, and wherein the respective inner layer regions comprising nuclear fuel material of the multiple fibers comprise at least 10% of the volume of the structure.

18. The structure of claim 1, wherein the nuclear fuel material comprises fissionable material.

19. A method comprising:
facilitating fabricating a nuclear fuel structure, the facilitating fabricating comprising:
providing a plurality of fibers wrapping in the structure over a surface of a support element of the nuclear fuel structure to, at least in part, provide structural reinforcement to at least a portion of the nuclear fuel structure;
forming a multilayer fuel region within at least one fiber of the plurality of fibers, the multilayer fuel region comprising:
an inner layer region comprising a nuclear fuel material; and
an outer layer region encasing the nuclear fuel material.

20. The method of claim 19, wherein the inner layer region comprising the nuclear fuel material is a first inner region, the multilayer fuel region further comprising a second inner layer region formed prior to forming the first inner layer region, the second inner layer region comprising a material to capture by-products of nuclear fission reactions occurring in the nuclear fuel material.

21. The method of claim 19, wherein the outer layer region is a first outer layer region, the multilayer fuel region further comprising a second outer layer region, the second outer layer region comprising a material to inhibit or moderate nuclear fission reactions occurring in the nuclear fuel material.

22. The method of claim 19, wherein forming at least one layer of the multilayer fuel region comprises a chemical vapor deposition process.

23. The method of claim 19, further comprising forming a plurality of discrete multilayer fuel regions along the at least one fiber of the plurality of fibers, wherein the multilayer fuel region is one multilayer fuel region of the plurality of discrete multilayer fuel regions, the plurality of discrete multilayer fuel regions comprising a respective inner layer region comprising the nuclear fuel material and a respective outer layer region encasing the nuclear fuel material.

24. The method of claim 19, wherein the facilitating fabricating further comprises:
providing an inner rod or tube structure as the support element of the nuclear fuel structure;
arranging the plurality of fibers to wrap around the inner rod structure so that the plurality of fibers provide structural reinforcement to the nuclear fuel structure.

25. The method of claim 19, wherein the facilitating fabricating further comprises:
providing an outer tube structure as the support element of the nuclear fuel structure;
arranging the plurality of fibers to wrap inside the outer tube structure so that the plurality of fibers provide structural reinforcement to the nuclear fuel structure.

26. A nuclear fuel structure comprising:
a plurality of fibers arranged in the structure;
a multilayer fuel region formed along a length of at least one fiber of the plurality of fibers, the multilayer fuel region comprising:
an inner layer region comprising a nuclear fuel material as a first inner region, and a second inner layer region covered by the first inner layer region, the second inner layer region comprising a nanoporous carbon material to capture by-products of nuclear fission reactions to occur within the nuclear fuel material; and
an outer layer region encasing the nuclear fuel material.

* * * * *